US 011878594B2

(12) United States Patent
Khozikov et al.

(10) Patent No.: US 11,878,594 B2
(45) Date of Patent: Jan. 23, 2024

(54) PROTECTION SYSTEM FOR AIRCRAFT ELECTRIC PROPULSION MOTOR AND MOTOR CONTROLLER

(71) Applicant: The Boeing Company, Chicago, IL (US)

(72) Inventors: Vyacheslav Khozikov, Bellevue, WA (US); Eugene V. Solodovnik, Lake Stevens, WA (US); Frederic Lacaux, Woodinville, WA (US); Kamiar J. Karimi, Kirkland, WA (US)

(73) Assignee: The Boeing Company, Arlington, VA (US)

( * ) Notice: Subject to any disclaimer, the term of this patent is extended or adjusted under 35 U.S.C. 154(b) by 7 days.

(21) Appl. No.: 17/721,401

(22) Filed: Apr. 15, 2022

(65) Prior Publication Data

US 2022/0402364 A1 Dec. 22, 2022

Related U.S. Application Data

(60) Provisional application No. 63/211,086, filed on Jun. 16, 2021.

(51) Int. Cl.
*B60L 3/04* (2006.01)
*B64D 27/24* (2006.01)
*G01R 31/12* (2020.01)

(52) U.S. Cl.
CPC ............... *B60L 3/04* (2013.01); *B64D 27/24* (2013.01); *G01R 31/1272* (2013.01); *B64D 2221/00* (2013.01)

(58) Field of Classification Search
None
See application file for complete search history.

(56) References Cited

U.S. PATENT DOCUMENTS 8,760,094 B2   6/2014   Solodovnik et al.
9,846,199 B2   12/2017  Vian et al.
(Continued)

OTHER PUBLICATIONS

Extended European Search Report dated Nov. 3, 2022 in European Patent Application No. 22177682.6 (European counterpart to the instant U.S. patent application).

(Continued)

*Primary Examiner* — Jared Fureman
*Assistant Examiner* — Aqeel H Bukhari
(74) *Attorney, Agent, or Firm* — Ostrager Chong Flaherty & Broitman P.C.

(57) ABSTRACT

Methods and apparatus for detecting and characterizing arc faults in an aerospace electric propulsion system and then coordinating the operation of various elements of the protection system to execute a fault-clearing sequence. In a current-based method, the arc is detected and characterized based on differential readouts from current sensors. The difference between currents measured at two ends of a protection zone are compared to a difference threshold. In a power-based method, the arc is detected and characterized based on differential readouts from voltage and current sensors. The differential voltage and current readouts are used to compute the respective powers at two ends of a protection zone. The difference between the respective powers is integrated over a period of time and then the integrated difference is compared to a difference threshold. A differential protection trip mode is invoked when the difference threshold is exceeded.

20 Claims, 9 Drawing Sheets

(56) References Cited

U.S. PATENT DOCUMENTS

| | | |
|---|---|---|
| 10,283,982 B2 | 5/2019 | Namou et al. |
| 10,330,739 B2 | 6/2019 | Quiambao et al. |
| 10,389,227 B2 | 8/2019 | Hokazono et al. |
| 10,473,710 B2 | 11/2019 | Sullivan |
| 2007/0279068 A1 | 12/2007 | Harres |
| 2008/0129307 A1* | 6/2008 | Yu .................. H02H 1/0015 |
| | | 324/522 |
| 2009/0204268 A1* | 8/2009 | Eaves ................ H02H 3/30 |
| | | 700/295 |
| 2014/0104734 A1 | 4/2014 | Prisse et al. |
| 2015/0311832 A1 | 10/2015 | Solodovnik et al. |
| 2016/0043537 A1 | 2/2016 | Wortberg et al. |
| 2017/0279287 A1 | 9/2017 | Solodovnik et al. |
| 2019/0123542 A1 | 4/2019 | Kambham |
| 2020/0290742 A1* | 9/2020 | Kumar .................. B64D 27/24 |

OTHER PUBLICATIONS

Faifer et al., "A Method for the Detection of Series Arc Faults in DC Aircraft Power Networks", 2013 IEEE International Instrumentation and Measurement Technology Conference Proceedings, May 6-9, 2013, Minneapolis, MN, USA.

Schoepf et al., "Mitigation and Analysis of Arc Faults in Automotive DC Networks", IEEE Transactions on Components and Packaging Technologies, vol. 28, Issue 2, Jun. 2005.

Grassetti et al., "A Novel Algorithm for the Parallel Arc Fault Identification in DC Aircraft Power Plants", 2012 IEEE International Instrumentation and Measurement Technology Conference Proceedings, May 13-16, 2012, Graz, Austria.

* cited by examiner

PROTECTION SYSTEM FOR AIRCRAFT ELECTRIC PROPULSION MOTOR AND MOTOR CONTROLLER

RELATED PATENT APPLICATION

This application claims the benefit, under Title 35, United States Code, Section 119(e), of U.S. Provisional Application No. 63/211,086 filed on Jun. 16, 2021.

BACKGROUND

The present disclosure generally relates to electrical power conversion systems and, in particular, to power conversion systems for converting direct current (DC) into alternating current (AC). In particular, the present disclosure relates to methods and apparatus for converting DC power into AC power in an aircraft electric propulsion system.

Aircraft having electrically powered propulsion systems (hereinafter "electric aircraft") are equipped with electric motors which convert electrical power into mechanical power. For example, an electric motor may turn one or more propellers on the aircraft to provide thrust. More specifically, the electric motor has loops of wire (hereinafter "stator windings") in a magnetic field. When current is passed through the stator wings, the magnetic field exerts torque on a rotor, which rotates a shaft. Electrical energy is converted to mechanical work in the process.

An electric aircraft may take various forms. For example, the electric aircraft may be an aircraft, a rotorcraft, a helicopter, a quadcopter, an unmanned aerial vehicle, or some other suitable type of aircraft. For electric aircraft, the batteries are large and designed to provide a large amount of power for the purpose of propulsion. In one implementation, the battery is connected to a high-voltage direct-current (HVDC) bus, which is also supplied by the generator source(s). As used in the aerospace industry and herein, the term "high voltage" in the context of direct current means any DC voltage higher than 500 $V_{DC}$. In conventional schemes such DC high voltage is typically derived from rectification of three-phase 230 $V_{AC}$ power.

In a HVDC system, undesirable arc faults may occur. An electric arc, or arc discharge, is an electrical breakdown of a gas that produces a prolonged electrical discharge. The current through a normally nonconductive medium such as air produces a plasma. State-of-the-art systems typically rely on overcurrent detection to protect against electrical faults in the HVDC power distribution system. Overcurrent protection is triggered using the square of current multiplied by time (hereinafter "$i^2t$") to protect against an excessive current that may damage the wire and adjacent structure. Typical overcurrent protection involves a passive solution such as a fuse and/or an active solution such as configuring a controller to open an electro-mechanical contactor in response to an overcurrent indication received from a current sensor.

Overcurrent protections are an efficient solution to isolate faults but are considered "slow" protection because the load current needs to be significantly over (greater than) the nominal current to be detected. The amount of incidental energy released during a fault with overcurrent can be unacceptably high. In a typical airborne electrical system, a "fast" protection may be activated in response to detection of current over 35 $A_{rms}$. For example, "fast" protection may be implemented using differential protection (DP) looking at leaking current in a particular zone of the system. Differential protection is a unit-type protection for a specified zone or piece of equipment. Differential protection works on the principle of Kirchhoff's current law, which states that for any node (junction) in an electrical circuit, the sum of currents flowing into that node is equal to the sum of currents flowing out of that node.

In accordance with a typical differential protection implementation, currents at two locations are measured, any difference between the two current measurements (indicating current leakage) is computed, and protection is triggered if the difference exceeds a preset threshold. The sensitivity of differential protection enables a much faster trigger than is the case when overcurrent protection is employed because differential protection is capable of sensing a small amount of leaking current in one zone without the load current exceeding the nominal current. For a high-impedance fault, the fault may be detected in an early phase of the short with small leaking current before the fault condition causes thermal runaway.

With high power and voltage potentially exceeding 1000 $V_{DC}$, an electric propulsion system would benefit by incorporation of the capability to provide "fast protection" using differential protection, thereby limiting the incidental energy generated during the fault.

SUMMARY

The subject matter disclosed in some detail below is directed to methods and apparatus for detecting and characterizing arc faults in an aerospace electric propulsion system and then coordinating the operation of various elements of the protection system to execute a fault-clearing sequence. With high power and voltage potentially exceeding 1000 $V_{DC}$, an electric propulsion system would benefit by incorporation of the capability to provide "fast" fault isolation using differential protection, thereby limiting the incidental energy generated during the fault. In accordance with one proposed implementation, a motor controller executes active short-circuit protection based on the information collected and processed in a differential protection control module (controller). The differential protection control module receives sensor data acquired across a differential protection zone and processes that sensor data to detect the occurrence of an arc in a battery pack. In accordance with current-based embodiments, the arc is detected and characterized based on differential readouts from current sensors which sense the currents at two ends of a protection zone. In the current-based embodiments, the difference between the respective measured currents at the two ends of the protection zone is compared to a difference threshold. A differential protection trip mode of operation is invoked when the difference threshold is exceeded.

In accordance with power-based embodiments, the arc is detected and characterized based on differential readouts from voltage and current sensors which sense the voltage and current at two ends of a protection zone. In the power-based embodiments, the differential readouts from the voltage and current sensors are then used to compute the respective measured powers at the two ends of the protection zone, integrate the difference between the respective measured powers over a period of time, and then compare that integrated difference to a difference threshold. The differential protection trip mode of operation is invoked when the difference threshold is exceeded.

One key difference with conventional aircraft power systems is that the electric propulsion electrical system is electrically floating, with isolated or high-impedance ground. Therefore, there is no short-circuit current during a line-to-ground fault. Another factor is the operating voltage of the system. With high voltage, different types of fault can happen with the possibility to have series and parallel arcing faults in the system, which are difficult to detect. Finally, the electric propulsion system includes a high-power motor that, during a HVDC fault, can regenerate into the fault. It is important for the system to discriminate which load has failed and isolate the fault. Healthy motor loads may regenerate during the fault, but may not be required to trip off.

The protection schemes proposed herein provide "fast" protection for airborne electric propulsion systems. The capabilities of the proposed protection system include: (a) the ability to detect a small leakage current for a high-impedance fault; (b) the ability to detect arcing faults (series and parallel); (c) the ability to isolate the fault in the faulty zone while preserving operation of healthy loads; and (d) system fault coordination.

Although various embodiments of systems and methods for providing differential protection for an electric propulsion system will be described in some detail below, one or more of those embodiments may be characterized by one or more of the following aspects.

One aspect of the subject matter disclosed in detail below is a method for protecting an electric propulsion system, the method comprising: (a) sensing a first current supplied by a battery pack at a first end of a protection zone that includes at least a portion of a power line that is connected to receive current from the battery pack and supply current to a motor controller; (b) sensing a second current supplied to the motor controller at a second end of the protection zone; (c) receiving sensor data representing a magnitude of the first current sensed in step (a); (d) receiving sensor data representing a magnitude of the second current sensed in step (b); (e) calculating a current difference equal to a difference between the magnitude of the first current and the magnitude of the second current; (f) determining that the current difference exceeds a difference threshold indicating a fault in the protection zone; (g) commanding the electric propulsion system to operate in a mode that isolates the fault in response to step (f); and (h) operating the electric propulsion system in a mode that isolates the fault, wherein steps (c) through (g) are performed by a differential protection control module.

Another aspect of the subject matter disclosed in detail below is an electric propulsion system comprising: a battery pack comprising parallel strings of battery modules; a busbar connected to receive DC power from the battery pack; a power line connected to receive DC power from the busbar; a motor controller connected to receive DC power from the power line and configured to convert the DC power to AC power; an AC motor connected to receive the AC power from the motor controller; one or more first current sensors connected to sense a first current supplied by the battery pack to a first end of a protection zone that includes at least a portion of the power line and configured to output first sensor data representing a magnitude of the first current; a second current sensor connected to sense a second current supplied to the motor controller at a second end of the protection zone and configured to output second sensor data representing a magnitude of the second current; and a differential protection control module connected to receive the first and second sensor data. The differential protection control module is configured to perform operations comprising: (a) calculating a current difference equal to a difference between the magnitude of the first current and the magnitude of the second current; (b) determining that the current difference exceeds a difference threshold indicating a fault in the protection zone; and (c) commanding the electric propulsion system to operate in a mode that isolates the fault in response to operation (b).

A further aspect of the subject matter disclosed in detail below is a method for protecting an electric propulsion system, the method comprising: (a) sensing a first current supplied by a battery pack at a first end of a protection zone that includes at least a portion of a power line that is connected to receive current from the battery pack and supply current to a motor controller; (b) sensing a second current supplied to the motor controller at a second end of the protection zone; (c) sensing a first voltage at the first end of the protection zone; (d) sensing a second voltage at the second end of the protection zone; (e) receiving sensor data representing a magnitude of the first current sensed in step (a); (f) receiving sensor data representing a magnitude of the second current sensed in step (b); (g) receiving sensor data representing a magnitude of the first voltage sensed in step (c); (h) receiving sensor data representing a magnitude of the second voltage sensed in step (d); (i) calculating an integrated power difference based on the magnitudes received in steps (e) through (h) at a succession of instants during a window of time, wherein the integrated power difference is derived by integrating a difference between a first power at the first end of the protection zone and a second power at the second end of the protection zone; a) determining that the integrated power difference exceeds an integrated difference threshold indicating a fault in the protection zone; (k) commanding the electric propulsion system to operate in a mode that isolates the fault in response to step (j); and (l) operating the electric propulsion system in a mode that isolates the fault, wherein steps (e) through (k) are performed by a differential protection control module.

Yet another aspect of the subject matter disclosed in detail below is an electric propulsion system comprising: a battery pack comprising parallel strings of battery modules; a busbar connected to receive DC power from the battery pack; a power line connected to receive DC power from the busbar; a motor controller connected to receive DC power from the power line and configured to convert the DC power to AC power; an AC motor connected to receive AC power from the motor controller; a first current sensor connected to sense a first current supplied by the battery pack to a first end of a protection zone that includes at least a portion of the power line and configured to output first sensor data representing a magnitude of the first current; a first voltage sensor connected to sense a first voltage at the first end of the protection zone current and configured to output second sensor data representing a magnitude of the first voltage; a second current sensor connected to sense a second current supplied to the motor controller at a second end of the protection zone and configured to output third sensor data representing a magnitude of the second current; a second voltage sensor connected to sense a second voltage at the second end of the protection zone current and configured to output fourth sensor data representing a magnitude of the second voltage; and a differential protection control module connected to receive the first through fourth sensor data. The differential protection control module is configured to perform operations comprising: (a) calculating an integrated power difference based on the first through fourth sensor data received at a succession of instants during a window of time, wherein the integrated power difference is derived by integrating a difference between a first power at the first end of the protection zone and a second power at the second end of the protection zone; (b) determining that the integrated power difference exceeds an integrated difference threshold indicating a fault in the protection zone; and (c) commanding the electric propulsion system to operate in a mode that isolates the fault in response to operation (b).

A further aspect of the subject matter disclosed in detail below is a method for protecting an electric propulsion system, the method comprising: (a) sensing a DC current supplied by a battery pack at a first end of a protection zone that includes at least a portion of a power line that is connected to receive DC current from the battery pack and supply DC current to a motor controller; (b) sensing AC currents supplied to an AC motor by the motor controller at a second end of the protection zone; (c) sensing a DC voltage at the first end of the protection zone; (d) sensing AC voltages at the second end of the protection zone; (e) receiving sensor data representing the magnitude of the DC current sensed in step (a); (f) receiving sensor data representing magnitudes of the AC currents sensed in step (b); (g) receiving sensor data representing a magnitude of the DC voltage sensed in step (c); (h) receiving sensor data representing magnitudes of the AC voltages sensed in step (d); (i) calculating an integrated power difference based on the magnitudes received in steps (e) through (h) at a succession of instants during a window of time and a magnitude of power losses inside the motor controller, wherein the integrated power difference is derived by integrating a difference between a first power at the first end of the protection zone and a second power at the second end of the protection zone minus the power losses; (j) determining that the integrated power difference exceeds an integrated difference threshold indicating a fault in the protection zone; (k) commanding the electric propulsion system to operate in a mode that isolates the fault in response to step (j); and (l) operating the electric propulsion system in a mode that isolates the fault, wherein steps (e) through (k) are performed by a differential protection control module.

Other aspects of systems and methods for providing differential protection for an electric propulsion system are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
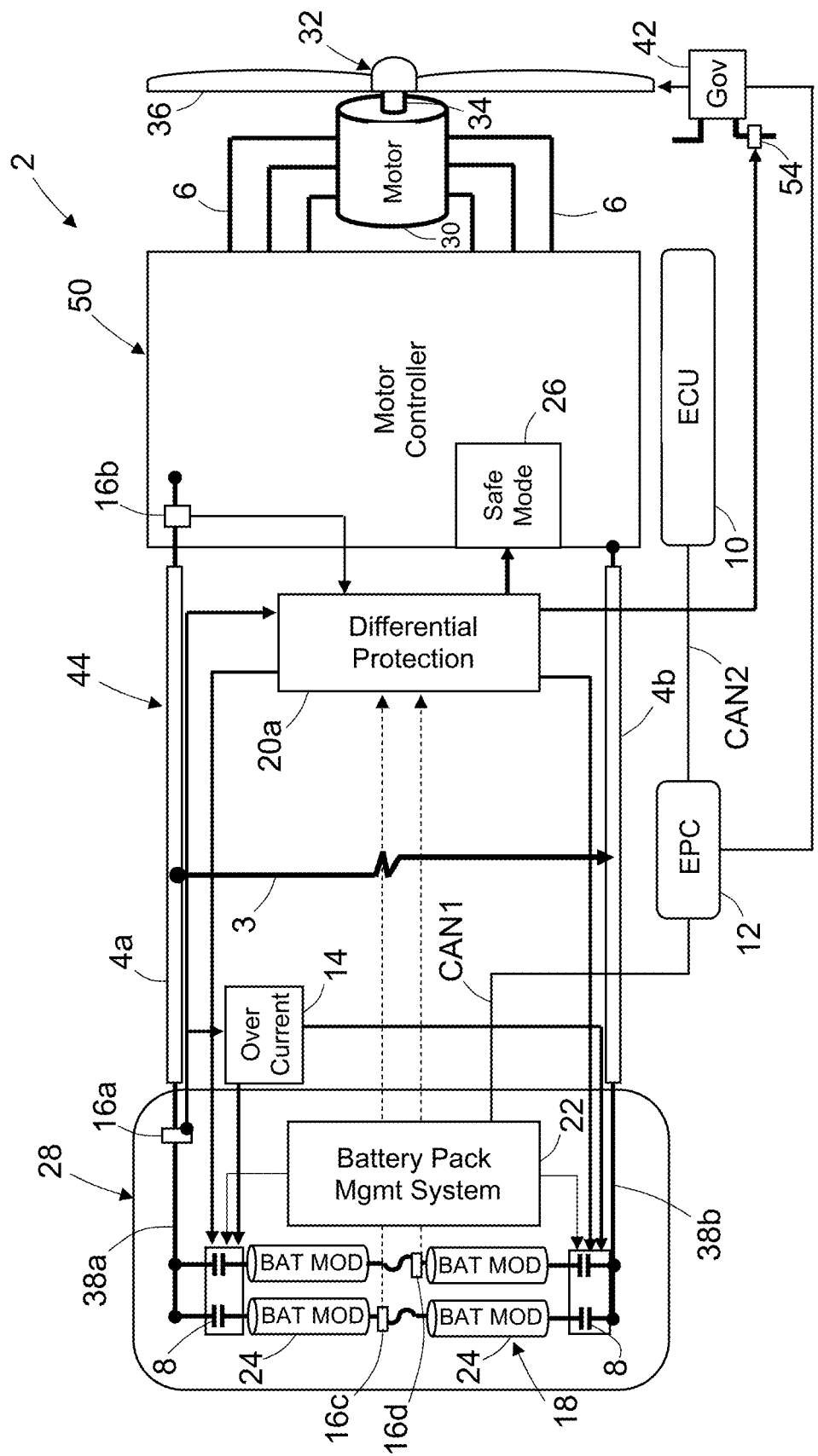
FIG. 1 is a diagram showing an arc fault across two DC power lines of an HVDC power distribution system in an aerospace electric propulsion system comprising a direct-current DP control module that monitors a DC protection zone in accordance with a first embodiment.

Illustrative embodiments of systems and methods for providing differential protection for an electric propulsion system are described in some detail below. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The airplane electric propulsion systems disclosed herein include an electric motor that drives rotation of the propeller, one or more motor controllers that are configured to convert direct current (DC) into alternating current (AC), and a DC power source (e.g., a battery system). The DC power source may include, for example, a DC-to-DC converter for increasing, or stepping-up, the voltage level of a low-voltage DC power source to form a high-voltage DC (HVDC) power source. As used herein, a DC-to-DC converter is an electrical or electromechanical device used to change the voltage level of the DC power source. The HVDC power may then be fed to one or more inverters of the motor controller to form a high-voltage AC power source.

With high power and voltage potentially exceeding 1000 $V_{DC}$, an electric propulsion system would benefit by incorporation of the capability to provide "fast" fault isolation using differential protection, thereby limiting the incidental energy generated during the fault. One key difference with conventional aircraft power systems is that the electric propulsion electrical system is electrically floating, with isolated or high-impedance ground. Therefore, there is no short-circuit current during a line-to-ground fault. Another factor is the operating voltage of the system. With high voltage, different types of fault can happen with the possibility to have series and parallel arcing faults in the system, which are difficult to detect. Finally, the electric propulsion system includes a high-power motor that, during a HVDC fault, can regenerate into the fault. It is important for the system to discriminate which load has failed and isolate the fault. Healthy motor loads may regenerate during the fault, but should not be tripped off.

The electric propulsion systems disclosed in detail below include at least one DP control module configured to: (a) receive sensor data from current and voltage sensors having locations that define a source end and a load end of a protection zone; (b) process that sensor data to derive current and voltage measurements; (c) detect when a difference in the measurements indicates the occurrence of a fault in the protection zone; and (d) trigger changes in the states of contactors and/or switches which protect the equipment of the electric propulsion system against damage by isolating the fault.

The protection schemes proposed herein provide "fast" protection for airborne electric propulsion systems. In particular, the DP control modules disclosed herein have one or more of the following capabilities: (a) the ability to detect a small leakage current for a high-impedance fault; (b) the ability to detect arcing faults (series and parallel); (c) the ability to isolate the fault in the faulty zone while preserving operation of healthy loads; and (d) system fault coordination.

FIG. 1 is a diagram showing an aerospace electric propulsion system 2 that converts DC power into AC power and is equipped with a direct-current differential protection control module 20a (hereinafter "DCDP control module 20a") in accordance with a first embodiment. The DCDP control module 20a depicted in FIG. 1 is configured to isolate an arc fault 3 between positive and negative HVDC power lines 4a and 4b of a HVDC power distribution system 44.

The electric propulsion system 2 includes a motor controller 50 that converts DC power from HVDC power distribution system 44 to AC power. Thus, the term "motor controller" as used herein includes a DC-to-AC converter (not shown in FIG. 1). The electric propulsion system also includes an AC motor 30 that receives AC power from motor controller 50 via pluralities or sets of AC power lines 6.

The electric propulsion system 2 depicted in FIG. 1 further includes a propeller 32 which is driven to rotate by the AC motor 30. The propeller 32 includes a propeller shaft 34 which is mechanically coupled to the output shaft (not shown in FIG. 1) of the AC motor 30 and a plurality of propeller blades 36. In addition, the electric propulsion system 2 includes a governor 42 which is configured to maintain a constant speed of rotation of the propeller 32 by varying the pitch of the propeller blades 36. Hydraulic governors accomplish this by using a hydraulic valve 54 to control the flow of engine oil through hydraulic mechanisms in the propeller 32.

In some implementations, the motor controller 50 has multiple channels for providing AC current to respective sets of stator windings in the AC motor 30. Each channel of the motor controller 50 comprises a respective inverter (not shown in FIG. 1) having a set of power switches and an inverter controller (not shown in FIG. 1) which controls the states of the power switches. The power switches are connected to the stator windings of AC motor 30. The motor controller 50 further includes a multiplicity of pairs of sensors (not shown in FIG. 1) which sense the voltages and currents of the AC power signals output by the inverters, which sensor data is fed back to the respective inverter controllers. The operation of inverters is controlled by the inverter controllers, which send switch control signals to and receive switch state signals from the inverters via switch signal lines (not shown in FIG. 1). The inverters of the motor controller 50 convert DC power into multi-phase AC power for the AC motor 30. The inverters and inverter controllers, in combination, form a DC-to-AC converter which is part of the motor controller 50. More specifically, the inverter controller generates pulse width-modulated signals that serve as reference currents and voltages that need to be sourced to the AC motor 30 in order to achieve optimal mechanical torque output. These reference signals are modulated using a PWM generation function which creates commands which are sent to the gate drivers of the power switches in the inverter controlled by the inverter controller.

In the embodiment depicted in FIG. 1, the DC power source is a battery pack 18. The battery pack 18 is connected to the HVDC power distribution system 44 via a battery power distribution unit 28 (hereinafter "BPDU 28"). The BPDU 28 is an enclosure that contains hardware needed for monitoring, commutating, and controlling the DC power output by the battery pack 18. The BPDU 28 includes positive and negative busbars 38a and 38b (hereinafter "busbars 38a and 38b"). The motor controller 50 receives DC power from BPDU 28 via the HVDC power distribution system 44.

In accordance with some embodiments, the battery pack 18 includes a plurality of independent battery strings connected in parallel to the busbars 38a and 38b. Each battery string comprises a number of battery modules 24 connected in series to produce a battery string with the required usable voltage/potential. In the example depicted in FIG. 1, each battery string includes a first half-string of (e.g., four) series-connected battery modules indirectly connected (via a respective mid-point battery disconnect unit not shown in FIG. 1) to a second half-string of (e.g., four) of series-connected battery modules.

The BPDU 28 further includes a first plurality of string contactors 8 that connect one end of the battery strings to busbar 38a and a second plurality of string contactors 8 that connect the other end of the battery strings to busbar 38b. (A contactor is an electrically controlled switch used for switching an electrical power circuit. Contactors are designed to be directly connected to high-current load devices.) The high-voltage DC power distribution system 44 receives DC power signals from the battery strings via string contactors 8 and supplies that DC power to the motor controller 50.

The BPDU 28 further includes a battery pack management system 22 (hereinafter "BPMS 22"). The operation of the battery pack 18 is managed by the BPMS 22. Multiple parallel battery strings may provide redundancy in case of pack internal failure, e.g., single string failure. The BPMS 22 may be configured to ensure redundant protections, fail-safe operation, and selective shutdown of battery strings. The BPMS 22 may be further configured to provide battery overcharge protection or to forestall other events or combination of events that could lead to battery thermal runaway. More specifically, the switching states of the string contactors 8 may be controlled by BPMS 22 to open in response to detection of a fault condition (e.g., a short circuit) in one of the battery strings.

The DC current flowing through the positive busbar 38a is sensed by a current sensor 16a. The current sensor 16a (and other current sensors referred to herein) is configured to output sensor data representing a magnitude of the sensed current. Each battery string includes a plurality of battery modules 24 connected in series. The DC current flowing through each battery string is sensed by a respective current sensor (e.g., current sensors 16c and 16d seen in FIG. 1). Each battery module 24 is a parallel/series arrangement of individual cells (not shown in FIG. 1). Each battery module 24 may be monitored by an associated module monitoring unit (not shown in FIG. 1). Each module monitoring unit includes sensors for independently sensing virtual cell voltage (the voltage across a plurality of parallel battery cells) and individual cell temperature. The module monitoring unit also includes balancing circuits. Each module monitoring unit incorporated in the battery pack 18 communicates sensor data representing virtual cell voltage and individual cell temperature to the BPMS 22. The BPMS 22 also receives data from current sensors 16c and 16d.

The system further includes a DC voltage conversion system (not shown in FIG. 1) that is configured to receive low-voltage DC power from battery pack 18 and convert that low-voltage DC power to high-voltage DC power. The HVDC power distribution system 44 depicted in FIG. 1 includes positive and negative HVDC power lines 4a and 4b that are connected to carry high-voltage DC power from the DC voltage conversion system to the motor controller 50. For example, the HVDC power lines 4a and 4b may be connected to a pair of HVDC busbars (not shown in FIG. 1), which busbars are in turn connected to receive HVDC power from the DC voltage conversion system.

The DC voltage conversion system (not shown in the drawings) comprises a voltage converter and a converter controller. The converter controller generates control signals according to specific switching modulation algorithms, for example, pulse width modulation, phase shift modulation, and interleaved modulation, or a combination of two or three, etc. The voltage converter is controlled by the converter controller using one of the aforementioned specific modulation methods to convert an input current at an input voltage to an output current at an output voltage while achieving specific electric performance requirements, for example, in terms of efficiency improvement, current ripple reduction, noise minimization, etc.

As seen in FIG. 1, the system further includes an engine control unit 10 (ECU). The engine control unit 10 interfaces with the inverter controllers (not shown in FIG. 1) inside the motor controller 50. The inverter controllers of motor controller 50 are communicatively coupled to receive control signals from engine control unit 10 and send feedback signals to engine control unit 10. The engine control unit 10 performs a role of supervision and coordination for all inverter controllers.

The engine control unit 10 is further communicatively coupled to an electric propulsion controller 20 (EPC) which controls the overall operation of the airplane electric propulsion system depicted in FIG. 1. The electric propulsion controller 12 receives pilot inputs from a thrust control lever and a pitch control lever (not shown in FIG. 1). The electric propulsion controller 12 communicates with the BPMS 22 via a first controller area network (CAN1) and with the engine control unit 10 via a second controller area network (CAN2). The electric propulsion controller 12 sends analog control signals to the governor 42 for controlling feathering of the propeller 32. The electric propulsion controller 12 sends information for display to a flight display unit (not shown in FIG. 1) via an Ethernet connection.

In normal operation, the battery pack 18 provides HVDC power to the motor controller 50. The motor controller 50 converts the DC power to AC power and drives rotation of the AC motor 30. The engine control unit 10 receives Run/Stop and Torque commands from the electric propulsion controller 12. The electric propulsion controller 12 monitors pilot inputs and the speed of the propeller. In response to a pilot input demanding thrust, the electric propulsion controller 12 calculates the Torque command for the motor controller 50. The motor controller 50 responds by applying AC currents having appropriate magnitudes and phases to the AC motor 30, which generates torque for rotating the propeller 32. The governor 42 adjusts the rotational speed of the propeller 32 by changing the pitch of the propeller blades 36. In the event that the pilot demands more thrust, the electric propulsion controller 12 commands more torque to the motor controller 50. The propeller 32 tends to increase its speed, but the governor 42 reacts on speed increase and in turn increases blade pitch, which results in thrust increase as commanded by the pilot. Thus, speed of the propeller 32 is maintained constant through all operation and propeller thrust is changed by changing the motor torque and propeller pitch settings.

The system depicted in FIG. 1 further includes over-current protection control module 14 configured to protect against faults in the HVDC power distribution system 44. The over-current protection control module 14 is configured to perform an algorithm by which the state of contactors 8 is controlled in dependence on whether the current flowing through the positive HVDC power line 4a is excessive (greater than a specified threshold) or not. The current flowing through the positive HVDC power line 4a is sensed by current sensor 16a, which outputs an analog signal to over-current protection control module 14 indicating the magnitude of that current. The overcurrent protection is triggered using the square of the current multiplied by the time ($i^2t$) to protect against an excess current potentially damaging the wires and the airplane.

Referring still to FIG. 1, the motor controller 50 includes protection circuitry 26 which is configured to cause the motor controller 50 to operate in a Safe mode in response to certain faults. The protection circuitry 26 is hardware based. The protection circuitry 26 is typically implemented by analog circuits. The protection circuitry 26 can issue switch control signals that respectively cause the power switches in the inverter to close in response to a command received from the electric propulsion controller 12 or from the DCDP control module 20a, which command is in turn issued in response to fault detection. More specifically, the protection circuitry 26 sends a low-power input to the gate drivers of the power switches.

FIG. 1 depicts a situation in which an arc fault 3 (e.g., a short circuit) has occurred between the HVDC power lines 4a and 4b. In this example, the HVDC power lines 4a and 4b may supply a nominal voltage of 1000-1600 $V_{DC}$ and carry a nominal current of 1000 $A_{DC}$. In the event of such a fault, the battery pack 18 can supply a large fault current that can be as high as 7000 $A_{DC}$. As previously mentioned, not only does the battery pack 18 feed the fault, but also the AC motor 30 feeds the fault through the motor controller 50.short-circuit current.

However, detection of a high-impedance fault is problematic using overcurrent protection because of the intermittent nature of arcing and relatively low energy emitted during the event. This disclosure proposes methods for detecting and characterizing an arc fault based on differential readouts from voltage and current sensors and then coordinating with the elements of protection to execute a fault clearing sequence.

In accordance with the embodiment depicted in FIG. 1, the DCDP control module 20a is configured to perform an algorithm in which the state of contactors 8 is controlled in dependence on whether the difference between the input current sensed at one location and the output current sensed at another location is greater than a specified current threshold or not. The first and second locations define a DC protection zone. In accordance with one embodiment, the DCDP control module 20a receives analog signals from a current sensor 16a that senses the current $I_{BPDU}$ flowing out of the BPDU 28 and from a current sensor 16b that senses the current $I_{MC}$ flowing into the motor controller 50. In accordance with one proposed implementation, current sensor 16a is located along positive busbar 38a and current sensor 16b is located along a conductor that connects power switches inside the motor controller 50 to the HVDC power line 4a. The DCDP control module 20a is configured to compute a current difference $I_{DP}=I_{BPDU}-I_{MC}$ and then compare $I_{DP}$ to a difference threshold $I_{thr}$, which may be equal to the product of a factor and a nominal current $I_{nominal}$ (for example, $0.1 \times I_{nominal}$). The DCDP control module 20a is capable of detecting small leakage currents between lines and then minimizing the incidental energy in the fault.

In the example implementation depicted in FIG. 1, the DCDP control module 20a only monitors the current in the positive HVDC power line 4a and does not measure current in the negative HVDC power line 4b. Thus, the differential protection configuration depicted in FIG. 1 creates a protection zone covering the positive HVDC power line 4a between two current sensors 16a and 16b. In case of a line-to-line fault in that zone, the DCDP control module 20a will compute $I_{pp}$ and sense the fault.

Figure 2:
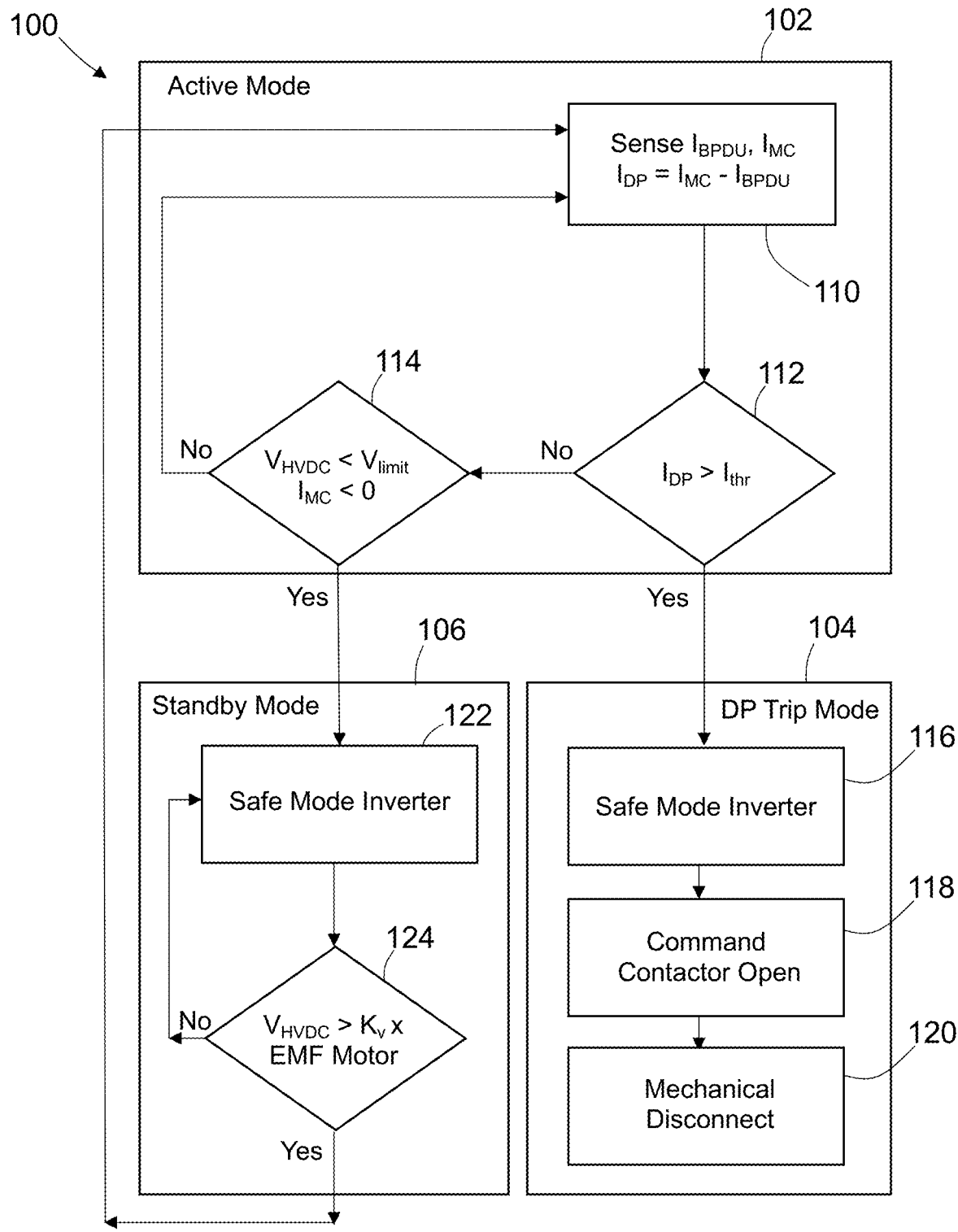
FIG. 2 is a flowchart identifying steps of an algorithm performed by the direct-current DP control module depicted in FIG. 1 in accordance with one proposed implementation.

Once a failure is detected in the DC protection zone, the DCDP control module 20a depicted in FIG. 1 will execute a trip sequence to isolate the fault with minimization of fault energy. FIG. 2 is a flowchart identifying steps of an algorithm 100 performed by the control logic of the DCDP control module 20a in accordance with one proposed implementation. In an Active mode 102, the DCDP control module 20a measures the currents $I_{BPDU}$ and $I_{MC}$ and computes the current difference $I_{DP}=I_{BPDU}-I_{MC}$ (step 110). Then the DCDP control module 20a determines whether the current difference $I_{DP}$ is greater than the difference threshold $I_{thr}$ or not (step 112).

If a determination is made in step 112 that current difference $I_{DP}$ is greater than difference threshold $I_{thr}$, then the DCDP control module 20a invokes (implements) a Differential Protection Trip mode 104 of operation (hereinafter "DP Trip mode 104") and exits the Active mode 102. In the DP Trip mode 104, the DCDP control module 20a issues a command that puts the inverter of the motor controller 50 in the Safe mode (step 116). The electric propulsion system includes large motor loads. During an HVDC system short circuit, the inverter will cease pulse width modulation and the motor will keep spinning due to system inertia. The motor/inverter system will regenerate high current into the fault. To limit the fault incidental energy, it is important to limit and block the motor/inverter current feedback into the fault. The protection logic will put the inverter/motor in Safe mode by activating an Active Short Circuit (ASC) mode for the inverter, which the top and/or bottom switches of the inverter are commanded ON to short the motor and block the regenerative current. Blocking the motor regenerative current is critical for limiting the incidental energy in the fault.

In response to detection of the arc fault 3 depicted in FIG. 1, the DCDP control module 20a is configured to cause the protection circuitry 26 to close all of the power switches in the inverter and cause the battery or bus contactors to open. More specifically, the power switches are subjected to an active short circuit after arc fault 3 occurs. Short circuiting the power switches has the effect of redirecting regenerated current from AC motor 30 to the motor controller 50 instead of to the Arc fault 3. The regenerated current will circulate between the AC motor 30 and the motor controller 50. More specifically, the electric current generated in the AC motor 30 goes to the power switches and circulates between the motor and power switches. Typically, the power switches are solid-state devices (e.g., transistors) which have been designed to handle high current. The power switches are actively cooled by liquid coolant (oil, mix of water and propylene glycol or any other media), which is the most efficient way of removing heat generated by the fault current flowing through power devices. The AC motor 30 is also actively cooled by similar liquid coolant. The ASC of the inverter in motor controller 50 can be commanded very quickly, within milliseconds. Because AC motor 30 and motor controller 50 are still actively cooled by liquid, the heating effect of the short-circuit current circulating between AC motor 30 and motor controller 50 is actively managed by the cooling system. Thus, all energy generated by the AC motor 30 is dissipated through losses in the motor and power switches and then removed by the active cooling system.

Referring again to FIG. 2, after the inverter has been placed in the Safe mode, the contactor 8 is commanded to open in order to isolate the faulty zone from the battery pack 18 (step 118). The short-circuit current from the battery pack 18 can be relatively high (>2000 $A_{DC}$ per string), and isolating the arc fault 3 (see FIG. 1) from the battery pack 18 quickly is important to minimize the fault energy. In the alternative, a dedicated load contactor (not shown in the drawings) connected to HVDC power line 4a may be opened to isolate the channel. Fault detection and confirmation time is selected to be around 10-15 msec. The opening of the contactor 8 can be within a 10-msec time frame for an electro-mechanical device or much faster (<1 msec) for a solid-state switch. The overall battery isolation time will range from 20 to 30 msec.

Depending on the system design, the last step of the DP Trip mode sequence is an optional mechanical disconnection of the AC motor 30 associated with the faulty zone (step 120). During the time that the AC motor 30 is spinning and the inverter is in the Safe mode, current is flowing between the AC motor 30 and the inverter, creating losses and heat. Stopping the motor rotation will stop the motor back EMF and feedback current between the AC motor 30 and the inverter. If required, the DCDP control module 20a is able to send analog control signals commanding the governor 42 to feather the propeller 32 by changing the pitch of the propeller blades 36 to reduce the air forces on propeller 32 and stop the motor spinning. More specifically, the DCDP control module 20a is able to command the governor pump (or another mechanical disconnect circuit) to stop the motor rotation by feathering the propeller 32 (or disengaging the motor mechanical drive). The propeller feathering process can take up to 10 seconds, during which the AC motor 30 acts approximately as a constant current source and continues to feed the fault, if no action is taken. To reduce the amount of motor-regenerated current feeding the fault during propeller feathering, the innovative technology proposed herein diverts current from the fault by shorting power switches in the motor controller 50 as previously described.

If a determination is made in step 112 that $I_{DP}$ is not greater than the difference threshold $I_{thr}$, then the DCDP control module 20a determines whether the voltage on the HVDC power line 4a ($V_{HVDC}$) is less than a voltage limit $V_{limit}$ or not (step 114). Faults occurring outside the DC protection zone will not be detected by the DCDP control module 20a. For battery internal faults, such faults would be isolated by battery internal protection such as that provided by the mid-point battery disconnect subsystem disclosed in U.S. Provisional Patent Application No. 63/089,729 filed on Oct. 9, 2020. If the fault causes the voltage $V_{HVDC}$ to sag enough, the motor/inverter system will regenerate and create significant current from the motor/inverter into the fault.

On the one hand, if the DCDP control module 20a determines in step 114 that the conditions $V_{HVDC}<V_{limit}$ and $I_{MC}<0$ are not satisfied, then the DCDP control module 20a returns to step 110. On the other hand, if a determination is made in step 114 that the HVDC system voltage $V_{HVDC}$ is less than $V_{limit}$ and the current $I_{MC}$ is less than zero, then the DCDP control module 20a switches to a Standby mode 106. In the Standby mode 106, the DCDP control module 20a issues a command that puts the inverter of the motor controller 50 in a Safe mode to block regenerative current (step 122). This action minimizes the fault energy from the external fault and limits the contribution of the motor/inverter.

While the inverter is in the Safe mode, the DCDP control module 20a further determines whether the HVDC system voltage $V_{HVDC}$ is greater than the product of a constant $K_v$ times the electromotive force of the AC motor 30 ($EMF_{motor}$) or not (step 124). On the one hand, if a determination is made in step 124 that the HVDC system voltage $V_{HVDC}$ is not greater than $K_v \times EMF_{motor}$, then the inverter remains in the Safe mode. On the other hand, if a determination made in step 124 that the HVDC system voltage $V_{HVDC}$ is greater than $K_v \times EMF_{motor}$ after the fault has been cleared, the motor/inverter will exit the Safe mode and the DCDP control module 20a returns to the Active mode 102.

The constant $K_v$ is called the voltage constant of the motor. Its value depends solely on motor design and construction. The constant relates voltage seen on motor terminals to electromotive force (EMF) generated by the motor. It is only applicable to permanent magnet motors.

The DC protection zone can be widened as much as possible by localization of the current sensor. It is possible to extend the zone by using current sensors installed at the mid-points of the respective battery strings seen in FIG. 1. The example battery depicted in FIG. 1 includes two battery strings consisting of battery modules connected in series. Each battery has a mid-point between two half-strings. FIG. 1 shows a pair of current sensors 16c and 16d which respectively sense the current flowing through the mid-points of the two battery strings. The outputs from current sensors 16c and 16d to the DCDP control module 20a are indicated by dashed arrows in FIG. 1. The DCDP control module 20a may be configured to sum the sensed currents for all battery strings to derive a measurement representing the total current being output by the battery pack 18 and then compare that total current from the battery pack to the current entering the motor controller 50 as sensed by the current sensor 16b. By doing so, the DC protection zone is including the battery pack 18 as part of the protected zone and any battery internal fault will be detected by the DCDP control module 20a and then isolated.

Arc faults can occur as series or parallel arcs. A series arc can occur when the conductor in series with the load breaks. However, the arc current cannot be greater than the load current. A parallel arc can occur as a short circuit or a ground fault. A short circuit arc decreases the dielectric strength of insulation separating the conductors, allowing a high-impedance, low-current arc fault to develop that carbonizes the conductor's insulation, further decreasing the effectiveness of the insulation separating the conductors. The result may be increased current and the release of rapidly increasing thermal energy. The current flow in a short-circuit parallel arc fault is limited by the impedances of the system and the arc fault.

The DC differential protection algorithm disclosed above is capable of detecting parallel arcing between lines with proper digital filtering to isolate the arcing signature. However, the DC differential protection is not capable to detect series arcing since there is no current leakage in that case.

Figure 3:
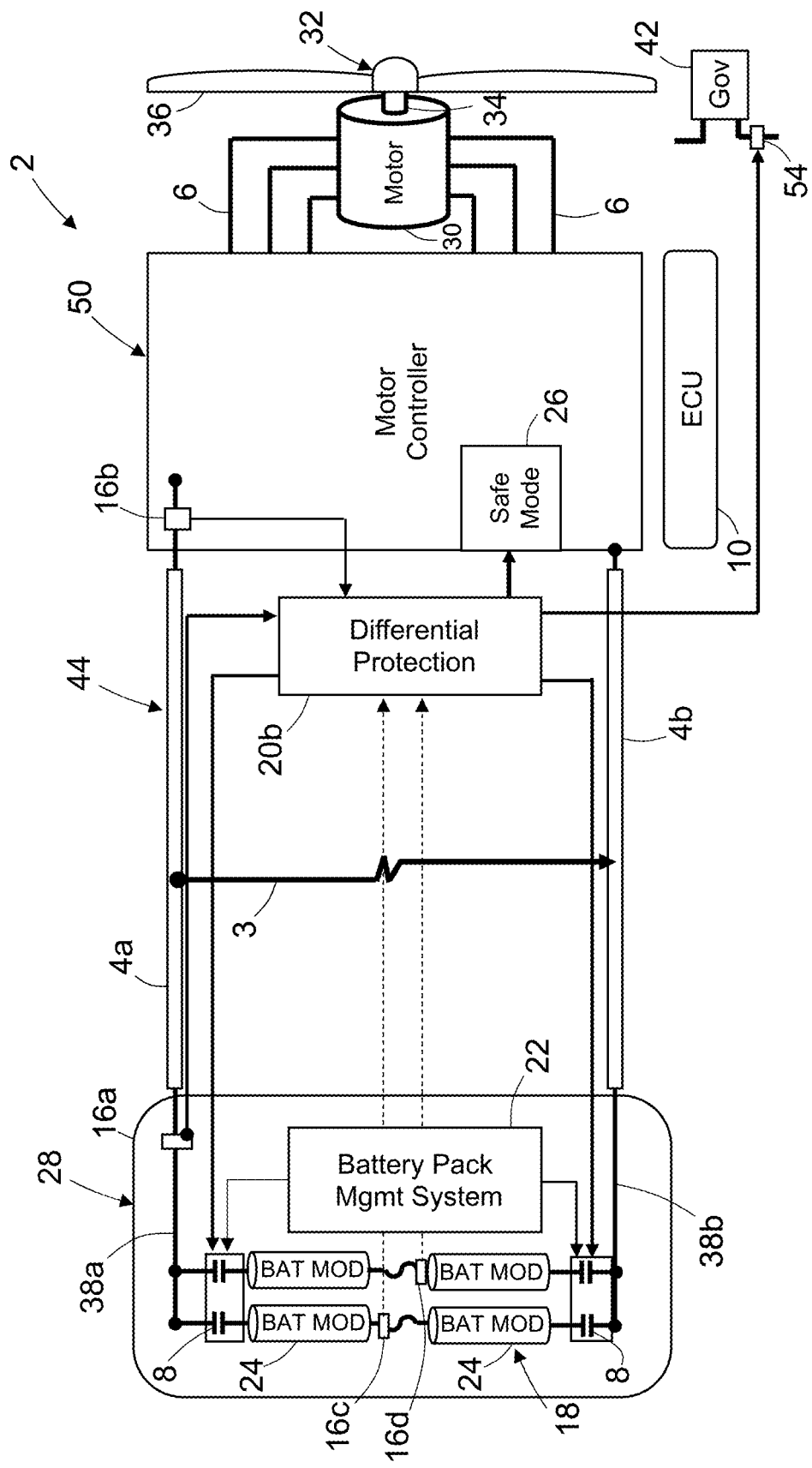
FIG. 3 is a diagram showing an arc fault across two DC power lines of an HVDC power distribution system in an aerospace electric propulsion system comprising a power DP control module that monitors a DC power protection zone in accordance with a second embodiment.

FIG. 3 is a diagram showing an aerospace electric propulsion system 2 that receives DC power from a battery pack 18 and is equipped with a power differential protection control module 20b (hereinafter "power DP control module 20b") in accordance with a second embodiment. The power DP control module 20b is configured to isolate an arc fault 3 that spans the HVDC power lines 4a and 4b.

In accordance with the embodiment depicted in FIG. 3, the power DP control module 20b is configured to perform an algorithm in which the state of contactors 8 is controlled in dependence on whether the difference between the input power at a first location and the output power at a second location is greater than a specified difference threshold or not. The first and second locations define a DC power protection zone.

In the specific example depicted in FIG. 3, the power DP control module 20b receives analog signals from a current sensor 16a that senses the current $I_{BPDU}$ flowing out of the BPDU 28 and from a current sensor 16b that senses the current $I_{MC}$ flowing into the motor controller 50. In addition, the power DP control module 20b receives analog signals from a first voltage sensor (not shown in FIG. 3) that senses the voltage $V_{BPDU}$ at the location where current $I_{BPDU}$ is sensed and a second voltage sensor (also not shown in FIG. 3) that senses the voltage $V_{MC}$ at the location where current $I_{MC}$ is sensed. The respective powers at each location are then computed and compared.

More specifically, the input power $P_{BPDU}=V_{BPDU}*I_{BPDU}$ at the input of the DC power protection zone and the output power $P_{MC}=V_{MC}*I_{MC}$ at the output of the DC power protection zone are computed. The power differential $P_{DP}$ is then computed by subtracting the output power $P_{MC}$ from the input power $P_{BPDU}$ ($P_{DP}=P_{BPDU}-P_{MC}$). An additional optional term can be used to take into account the feeder losses using the product $R_{feeder}*I_a^2$. Without a fault, the difference of powers between the input and output of the DC power protection zone shall be equal to zero based on the law of conservation of energy. The power DP control module 20b is configured to compute a power differential $P_{DP}=P_{BPDU}-P_{MC}$ and then compare $P_{DP}$ to a difference threshold $P_{thr}$, for example, $0.1 \times P_{nominal}$. In case of a fault in the DC power protection zone, $P_{BPDU}$ and $P_{MC}$ will be different since the energy of the fault will be seen in $P_{BPDU}$ but not in $P_{MC}$. This protection is capable to detect small leakage energy between lines and minimize the incidental energy in the fault.

In the example implementation depicted in FIG. 3, the power DP control module 20b only monitors the power in the positive HVDC power line 4a and does not measure the power in the negative HVDC power line 4b. Additionally, the voltages $V_{BPDU}$ at the output of the BPDU 28 and the voltage $V_{MC}$ at the input of the motor controller 50 are measured. Thus, the differential protection configuration depicted in FIG. 3 creates a zone covering the positive HVDC power line 4a between two measurement points. In case of a line-to-line fault in that zone, the power DP control module 20b will compute $P_{DP}$ and sense the fault.

The use of voltage in the power differential protection algorithm increases the sensitivity of the protection. The power differential protection algorithm is capable to detect parallel arcing between lines with proper digital filtering to isolate the arcing signature. For parallel arcing, the algorithm relies on sensing the difference between the respective currents used to compute $P_{BPDU}$ and $P_{MC}$ to detect the failure. For example, if the current leakage is 30 $A_{DC}$, with a voltage of 1000 $V_{Dc}$ at both ends of the DC power protection zone, the power differential $P_{DP}$ will be in the range from several tens or a hundred watts to several tens of kilowatts depending on the parallel or series nature of the arc. For serial arcing, the algorithm relies on sensing the difference between the respective voltages used to compute $P_{BPDU}$ and $P_{MC}$ to detect the failure. For example, if the arc voltage is 30 $V_{DC}$ and the current is 1000 $A_{DC}$, the power differential $P_{DP}$ will be equal to 30 kW minus losses in the power feeder. Thus, the power differential protection technique proposed herein is capable to detect both parallel and series arcing. The proposed solution uses HVDC line-to-line (rail-to-rail) voltage monitoring and single-rail current monitoring.

Figure 4:
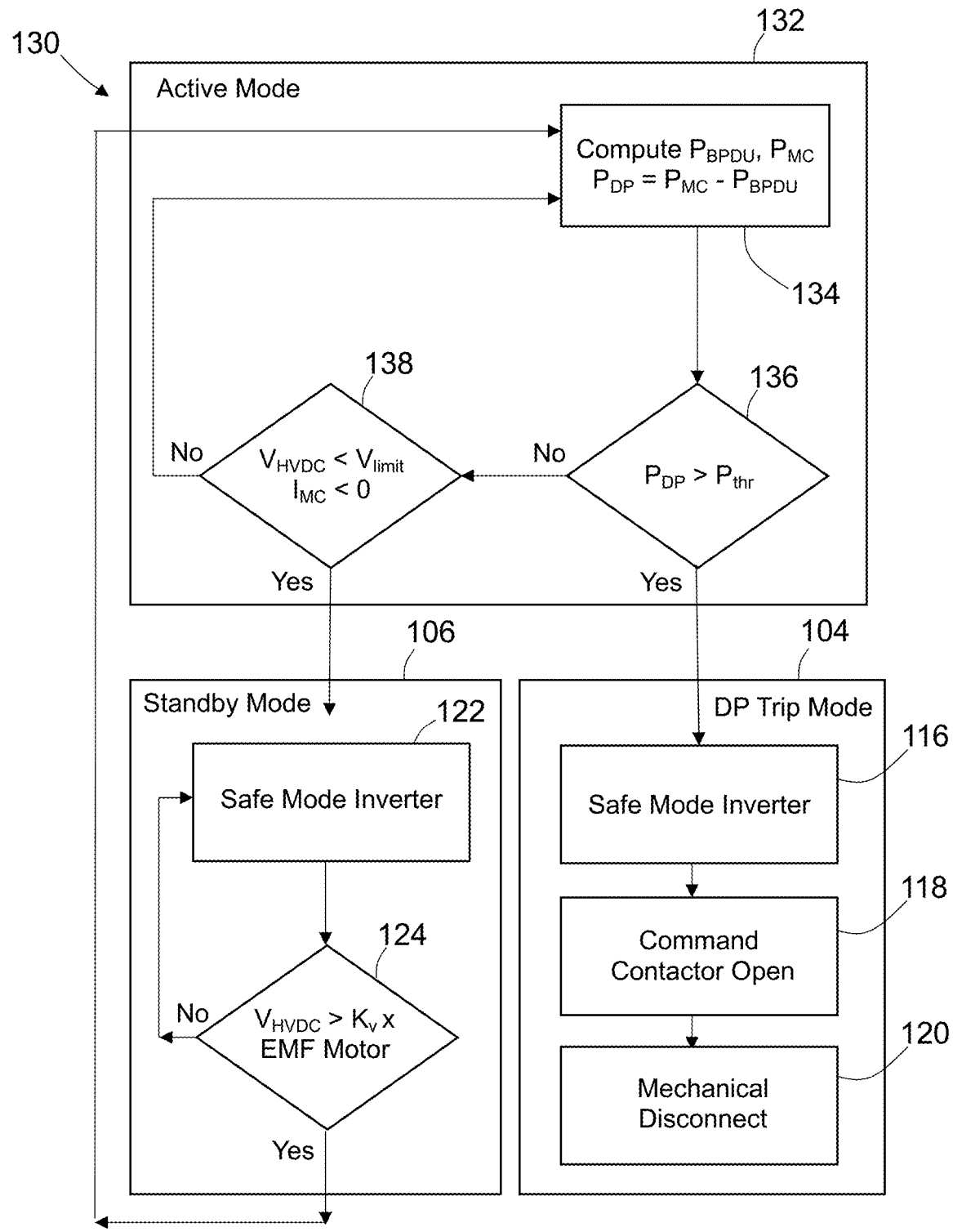
FIG. 4 is a flowchart identifying steps of an algorithm 130 performed by the power DP control module depicted in FIG. 3 in accordance with another proposed implementation.

Once a failure is detected in the protection zone, the power DP control module 20b depicted in FIG. 3 will execute a trip sequence to isolate the fault with minimization of fault energy. FIG. 4 is a flowchart identifying steps of an algorithm 130 performed by the control logic of the power DP control module 20b in accordance with one proposed implementation. In an Active mode 132, the power DP control module 20b first computes the powers $P_{BPDU}$ and $P_{MC}$ and then computes the differential protection power $P_{DP}=P_{BPDU}-P_{MC}$ (step 134). Then the power DP control module 20b determines whether the differential protection power $P_{DP}$ is greater than the difference threshold $P_{thr}$ or not (step 136).

If a determination is made in step 136 that differential protection power $P_{DP}$ is greater than difference threshold $P_{thr}$, then the power DP control module 20b changes from the Active mode 132 to the previously described DP Trip mode 104. In the DP Trip mode 104, the DCDP control module 20a issues a command that puts the inverter of the motor controller 50 in the Safe mode (step 116). After the inverter has been placed in the Safe mode, the contactor 8 is commanded to open in order to isolate the faulty zone from the battery pack 18 (step 118). Depending on the system design, the last step of the DP Trip mode sequence is an optional mechanical disconnection of the AC motor 30 associated with the faulty zone (step 120).

If a determination is made in step 136 that the differential protection power $P_{DP}$ is not greater than the difference threshold $P_{thr}$, then the power DP control module 20b determines whether the voltage on the HVDC power line ($V_{HVDC}$) is less than a voltage limit ($V_{limit}$) and the current $I_{MC}$ is less than zero or not (step 138). Faults occurring outside the protection zone will not be detected by the power DP control module 20b. As previously mentioned, if the fault caused the voltage $V_{HVDC}$ to sag enough, the motor/inverter system will regenerate and create significant current from the motor/inverter into the fault.

On the one hand, if the power DP control module 20b determines in step 138 that the conditions $V_{HVDC}<V_{limit}$ and $I_{MC}<0$ are not satisfied, then the power DP control module 20b returns to step 132. On the other hand, if a determination is made in step 138 that the HVDC system voltage $V_{HVDC}$ is less than $V_{limit}$ and the current $I_{MC}$ is less than zero, then the power DP control module 20b switches to the Standby mode 106 and performs steps 122 and 124 in the manner previously described with reference to FIG. 2.

In accordance with the proposed implementation depicted in FIG. 3, power is computed based on current and voltage information acquired at a location within BPDU 28 and a location within motor controller 50. However, the currents and voltages may be measured at locations which are farther apart than the locations of current sensors 16a and 16b in order to expand the length of the DC power protection zone.

Power-based differential protection may be implemented in a variety of ways. The power detection circuitry may be used to process data to reach a conclusion regarding whether the state of the electric propulsion system is normal or abnormal. Sought abnormalities include but are not limited to overcurrent due to a hard fault, high-impedance parallel arcs, and series arcs. Overcurrent may be easily detected by monitoring current at the source and at the load using current sensors as previously described, and then determining whether the overcurrent condition is satisfied or not, e.g., if a sensed current is >50% above the nominal current (hard fault).

As used herein, the term "hard fault" means a fault that causes abrupt changes in the system structure, which results in an uncontrolled transition from the nominal mode of operation to a faulty mode. A soft fault causes a continuous change over time of certain system structure parameters, which results in unknown additive disturbances.

Figure 5:
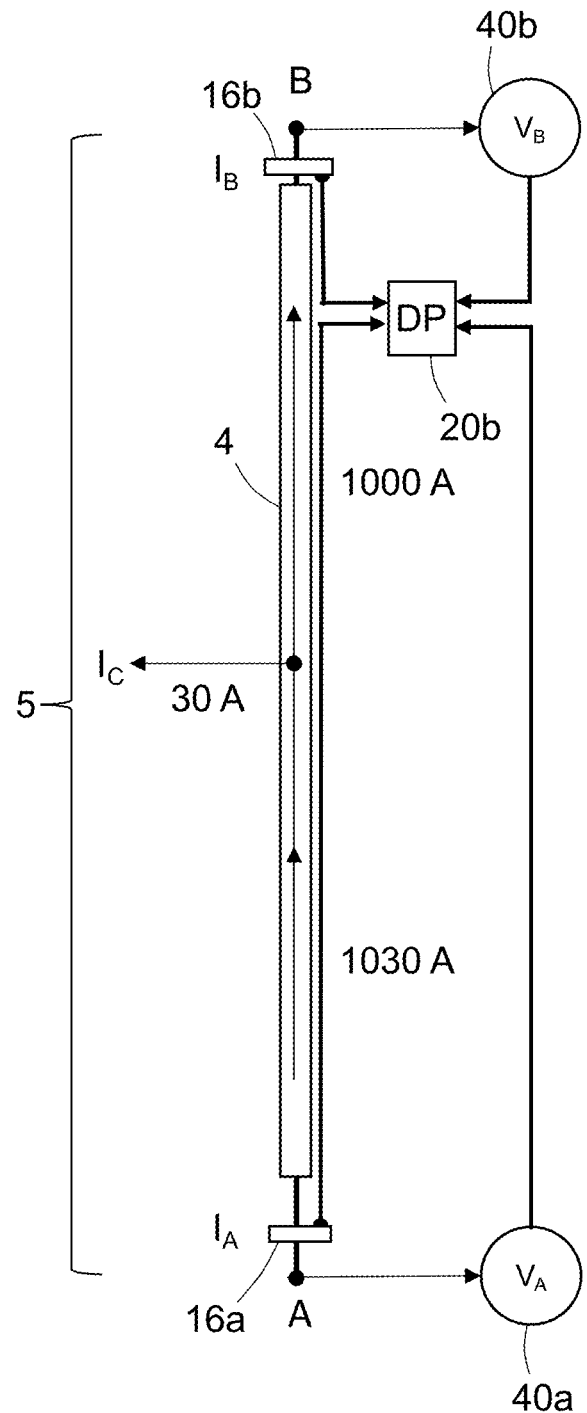
FIG. 5 is a diagram representing a scenario in which a power DP control module is detecting the occurrence of a high-impedance parallel arc along a rail of an HVDC busbar.

FIG. 5 is a diagram representing a scenario in which a power DP control module 20b is detecting the occurrence of a high-impedance parallel arc in a DC power protection zone 5 that includes at least a portion of a power line 4. In the scenario depicted in FIG. 5, the input current $I_A$ equals 1,030 A at the source end A of protection zone 5. In this example, the high-impedance parallel arc produces a leakage current $I_C$=30 A (indicated by an arrow), which results in a current $I_B$=1,000 A at or near the load end B of DC power protection zone 5. The source end A and load end B define a DC power protection zone 5 which is monitored by power DP control module 20b. In accordance with one proposed implementation, the source end A of the protection zone 5 is located along the positive busbar 38a seen in FIG. 1 and the load end B is located inside the motor controller 50 and before the inverter (e.g., along a bus that connects the power switches to the HVDC power line 4a).

In accordance with the embodiment depicted in FIG. 5, the power DP control module 20b receives sensor data from current sensors 16a and 16b indicating the magnitudes of currents $I_A$ and $I_B$ respectively. In addition, the power DP control module 20b receives sensor data from voltage sensors 40a and 40b which may be processed to measure the magnitudes of voltages $V_A$ and $V_B$ at or near the source end A and load end B respectively.

Figure 5B:
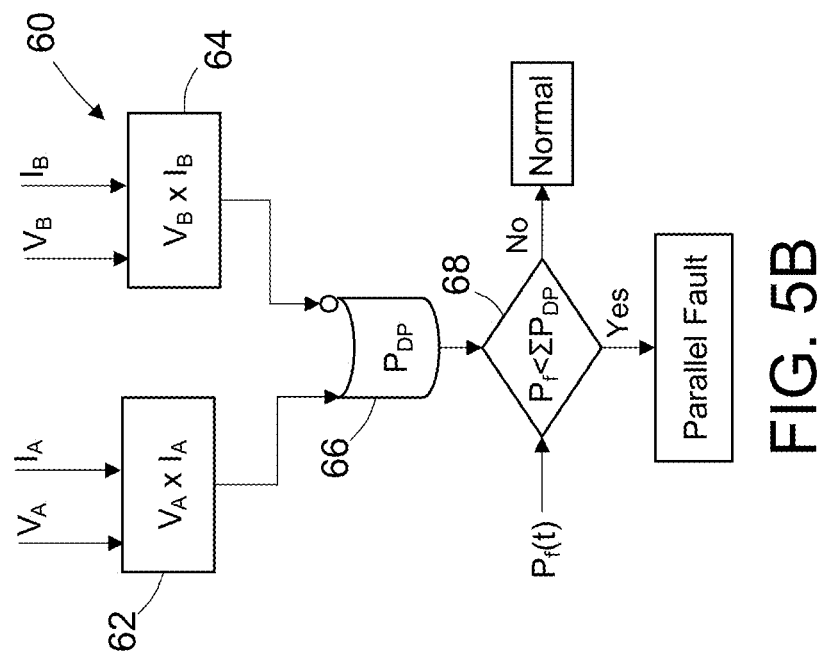
FIG. 5B is a flowchart showing the detection algorithm performed by the power DP control module in accordance with one method for monitoring the DC power protection zone depicted in FIG. 5 to detect a parallel arc.
Figure 5A:
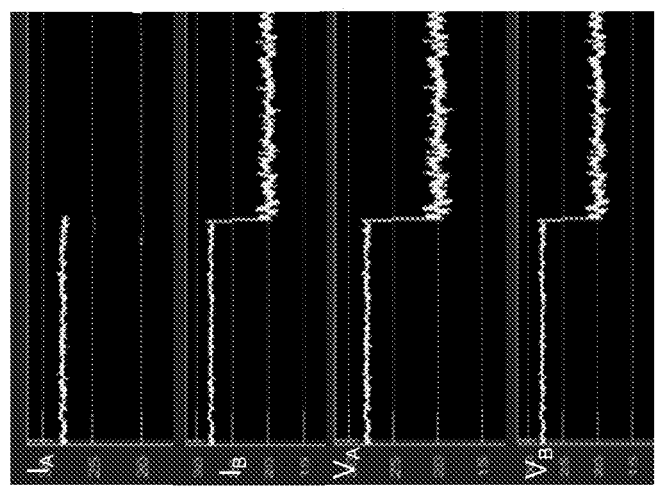
FIG. 5A is a screenshot from an oscilloscope showing currents $I_A$ and $I_B$ and voltages $V_A$ and $V_B$ during the occurrence of a high-impedance parallel arc within the DC power protection zone depicted in FIG. 5.

FIG. 5A is a screenshot from an oscilloscope showing currents $I_A$ and $I_B$ and voltages $V_A$ and $V_B$ during the occurrence of a high-impedance parallel arc within the DC power protection zone depicted in FIG. 5. FIG. 5B is a flowchart showing the detection algorithm 60 performed by the power DP control module 20b in accordance with one method for monitoring the DC power protection zone 5 depicted in FIG. 5 to detect a parallel arc.

In accordance with the proposed implementation depicted in FIG. 5B, the power DP control module 20b includes a first multiplier 62 that receives current $I_A$ and voltage $V_A$, computes the product (namely, power $P_A$) by multiplying the current $I_A$ times the voltage $V_A$, and then outputs the power $P_A$ to an integrator 66. The power DP control module 20b further includes a second multiplier 64 that receives current $I_B$ and voltage $V_B$, computes the product (namely, power $P_B$) by multiplying the current $I_B$ times the voltage $V_B$, and then outputs the power $P_B$ to the integrator 66. However, the output from the second multiplier 64 is inverted before being input to integrator 66. The integrator 66 then sums the power $P_A$ and the inverted power $P_B$ to compute the power difference $P_{DP}$ ($P_{DP}=P_B-P_A$) at successive instants in time. The power difference $P_{DP}$ is integrated over a period (window) of time. The integrator 66 outputs the integrated power difference $\Sigma P_{DP}$ to decision logic 68. The decision logic 68 determines whether the integrated power difference $\Sigma P_{DP}$ is greater than an integrated power difference threshold indicating the occurrence of a fault (hereinafter "fault threshold $P_f$") or not. The value of fault threshold $P_f$ value is also based on integrating power differences over a period of time. The fault threshold $P_f$ is selected such that exceedance of the fault threshold $P_f$ indicates the presence of a parallel arc.

On the one hand, if a determination is made by decision logic 68 that the integrated power difference $\Sigma P_{DP}$ is not greater than the fault threshold $P_f$, then the decision logic 68 issues a status signal indicating that the state of power line 4 is normal. On the other hand, if a determination is made by decision logic 68 that the integrated power difference $\Sigma P_{DP}$ is greater than the fault threshold $P_f$, then the decision logic 68 decides that a parallel arc fault is present and issues a control signal which switches the power DP control module 20b from the Active mode 132 to the DP Trip mode 104 (see FIG. 4).

In the scenario depicted in FIG. 5, the leakage current $I_C$ flows from the normal current path and therefore the current sensor 16b senses proportionally smaller current as compared to the current sensed by current sensor 16b. There is a strong assumption, confirmed by scientific literature, that the voltage drop across a DC arc can be higher than 20 V depending on the materials of the conductors between which the current is leaking. Therefore, for example, if the leakage current is 10 A or higher, the power dissipated in the arc can be 200 W or more (some literature revealed that in the automotive industry, for example, the measurable arc energies can be above approximately 50 W, while a more realistic expectation is that the arc's power for a high-voltage system will be above 600 W). Another source of power loss is Joule heat generated by wires. (Joule heating is the process by which the flow of electric current through a conductor produces heat.) In practice, Joule heating cannot be eliminated due to the increased weight associated with higher-gauge wires. Therefore it is reasonable to assume that the wire resistance is in the range of 10-100 mΩ. For fully electric propulsion applications, the values of load current are typically several hundred amperes. Therefore, the losses would amount to hundreds of watts. One may reasonably assume power losses greater than 300 W.

Thus, the power DP control module 20b may be configured to look for a difference in power between the source end and load end, measured as a product of voltage and current, including combined losses due to the leak and in the wires, in the range of 900 W and above. The value of the fault threshold $P_f$—exceedance of which indicates a parallel arc—may be set equal to 900 W or a similar value. To address intermittency of a parallel arc (as well as of a series arc), the power difference $P_{DP}$ is integrated over a period of time to mitigate capacitive and inductive effects of the system. In order to maximize the power difference, the power dissipated in the cables should be calculated based on the readout from current sensor 16b during normal operation since the power difference $P_{DP}$ is essentially power loss in the cables, while during the arcing there is an additional power loss in the arc.

Figure 6:
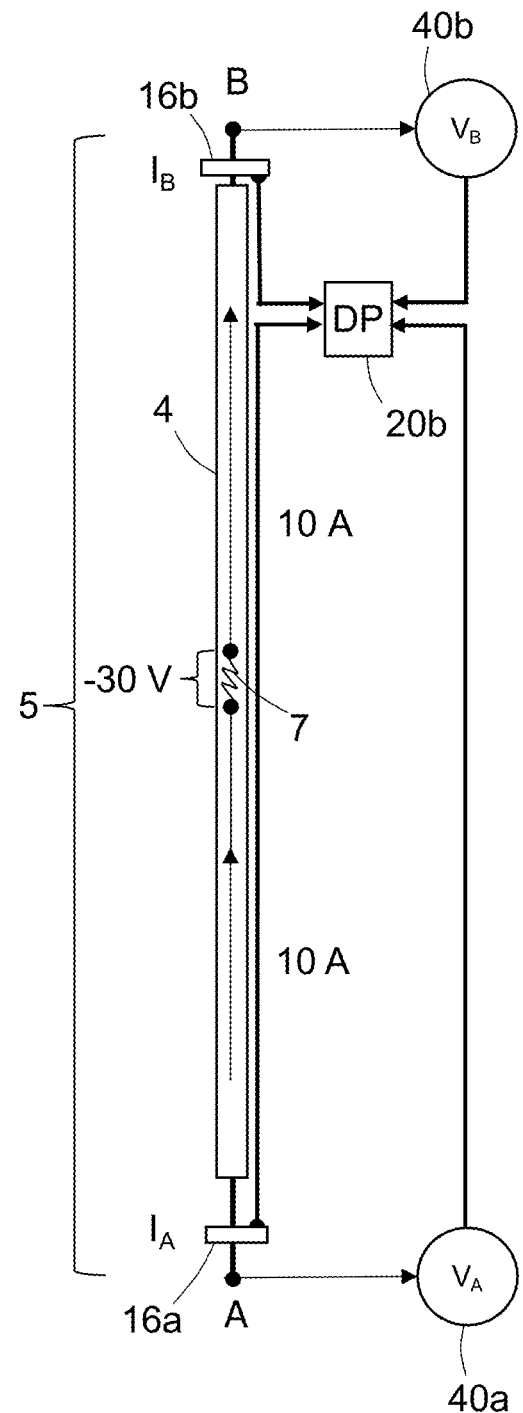
FIG. 6 is a diagram representing a scenario in which a power DP control module is detecting the occurrence of a series arc along a rail of an HVDC busbar.

FIG. 6 is a diagram representing a scenario in which a power DP control module 20b is detecting the occurrence of a series arc in a DC power protection zone 5 that includes at least a portion of a power line 4. In the scenario depicted in FIG. 6, the input current $I_A=10$ A at the source end A of DC power protection zone 5 and the output current $I_B=10$ A at the load end B of DC power protection zone 5. In this example, series arc 7 produces a voltage loss of −30 V. Again, the source end A and load end B define a DC power protection zone 5 which is monitored by power DP control module 20b. In accordance with one proposed implementation, the source end A of the protection zone 5 is located along the positive busbar 38a seen in FIG. 1 and the load end B is located inside the motor controller 50 and before the inverter (e.g., along a bus that connects the power switches to the HVDC power line 4a).

In accordance with the embodiment depicted in FIG. 6, the power DP control module 20b receives sensor data from current sensors 16a and 16b indicating the magnitudes of currents $I_A$ and $I_B$ respectively. In addition, the power DP control module 20b receives sensor data from voltage sensors 40a and 40b which indicate the magnitudes of voltages $V_A$ and $V_B$ at or near the source end A and load end B respectively.

Figure 6B:
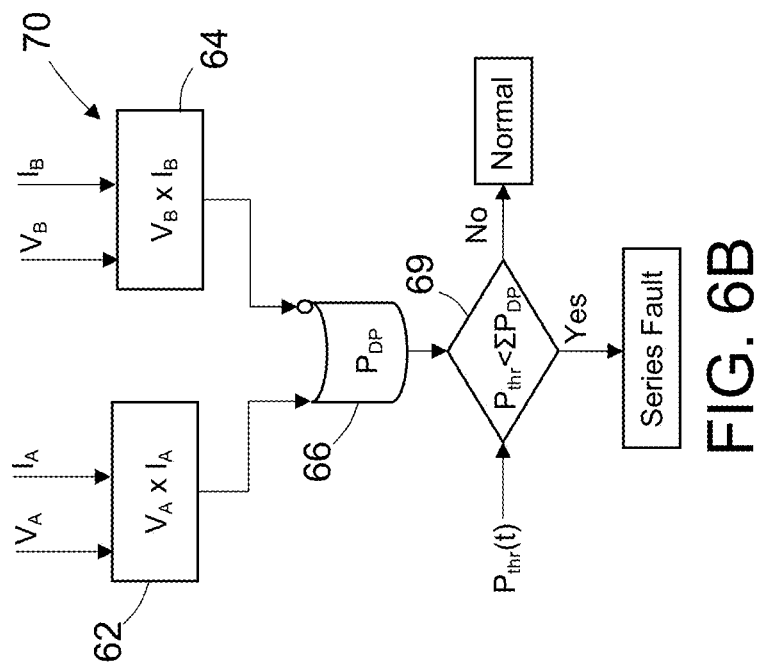
FIG. 6B is a flowchart showing detection algorithm performed by the power DP control module in accordance with another method for monitoring the DC power protection zone depicted in FIG. 6 to detect a series arc.
Figure 6A:
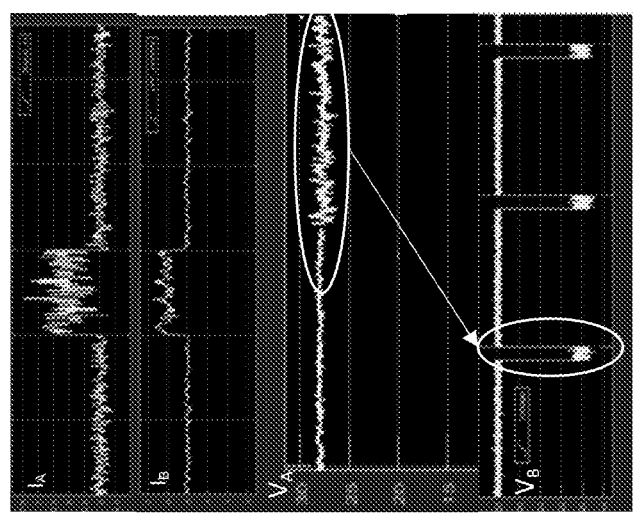
FIG. 6A is a screenshot from an oscilloscope showing currents $I_A$ and $I_B$ and voltages $V_A$ and $V_B$ during the occurrence of a series arc within the DC power protection zone depicted in FIG. 6.

FIG. 6A is a screenshot from an oscilloscope showing currents $I_A$ and $I_B$ and voltages $V_A$ and $V_B$ during the occurrence of the series arc 7 within the DC power protection zone depicted in FIG. 6. The encircled fragments correspond to the same instance of a series arc. The $V_A$ and $V_B$ traces were captured at different time scales. FIG. 6B is a flowchart showing the detection algorithm 70 performed by the power DP control module 20b in accordance with one method for monitoring the DC power protection zone depicted in FIG. 6 to detect a series arc 7.

In accordance with the proposed implementation depicted in FIG. 6B, the power DP control module 20b includes a first multiplier 62 that receives current $I_A$ and voltage $V_A$, computes the product (namely, power $P_A$) by multiplying the current $I_A$ times the voltage $V_A$, and then outputs the power $P_A$ to an integrator 66. The power DP control module 20b further includes a second multiplier 64 that receives current $I_B$ and voltage $V_B$, computes the product (namely, power $P_B$) by multiplying the current $I_B$ times the voltage $V_B$, and then outputs the power $P_B$ to the integrator 66. However, the output from the second multiplier 64 is inverted before being input to integrator 66. The integrator 66 then sums the power $P_A$ and the inverted power $P_B$ and computes the power difference $P_{DP}$ ($P_{DP}=P_B-P_A$) at successive instants in time. The power difference $P_{DP}$ is integrated over a period (window) of time. The integrator 66 outputs the integrated power difference $\Sigma P_{DP}$ to decision logic 69. The decision logic 69 determines whether the integrated power difference $\Sigma P_{DP}$ is greater than a difference threshold $P_{thr}$ or not. The difference threshold $P_{thr}$ value is also based on integrating power over a time period which is sufficient to reach a conclusion regarding the sustainability of the series arc to cause damage to insulation. Exceedance of the difference threshold $P_{thr}$ indicates the presence of a series arc 7.

On the one hand, if a determination is made by decision logic 69 that the integrated power difference $\Sigma P_{DP}$ is not greater than the difference threshold $P_{thr}$, then the decision logic 69 issues a status signal indicating that the state of power line 4 is normal. On the other hand, if a determination is made by decision logic 69 that the integrated power difference $\Sigma P_{DP}$ is greater than the difference threshold $P_{thr}$, then the decision logic 69 decides that a series arc fault is present and issues a control signal which switches the power DP control module 20b from the Active mode 132 to the DP Trip mode 104 (see FIG. 4).

The detection algorithm 70 for the series arc 7 is similar to the detection algorithm 60 used to detect a parallel arc, with the main difference being that the higher drop in in-line voltage at the load end B results in a greater change in the value of power differential $P_{DP}$. Also, since the current is the same at source end A and load end B, the major contributor to the change in the value of power differential $P_{DP}$ is the voltage drop across the series arc. Yet the process of integration allows the power DP control module 20b to include the effects of low- or high-order harmonics produced by the arc.

Figure 7:
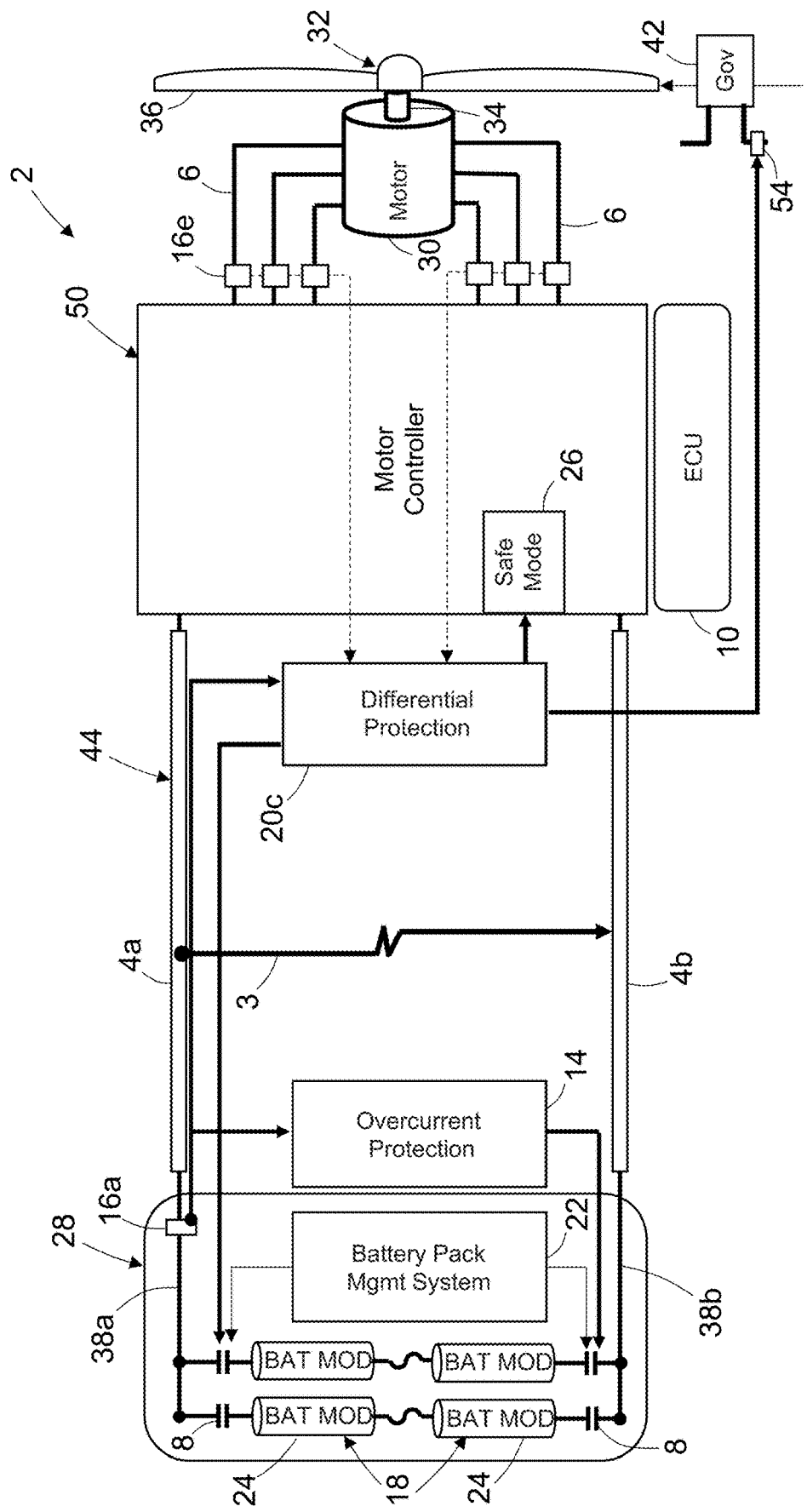
FIG. 7 is a diagram showing an arc fault across two DC power lines of an HVDC power distribution system in an aerospace electric propulsion system comprising a hybrid (DC/AC) power DP control module that monitors a DC/AC power protection zone in accordance with a third embodiment.

In the embodiments depicted in FIGS. 1 and 3, the DC power carried by the HVDC power distribution system 44 is being monitored by a DP control module. 20a. FIG. 7 is a diagram showing an arc fault 3 across positive and negative HVDC power lines 4a and 4b in an aerospace electric propulsion system comprising a hybrid power DP control module 20c that monitors a DC/AC power protection zone in accordance with a third embodiment. The third embodiment uses the power differential concept to include in the power protection zone the power inverter (in motor controller 50) and optionally the motor winding (in AC motor 30). The power differential concept enables implementation of a hybrid power DP control module 20c that monitors the DC/AC power protection zone that encompasses parts of both the DC power system and the AC power system by using the law of energy conservation to establish a relation between both power systems.

In accordance with the third embodiment, the hybrid power DP control module 20c is configured to perform a hybrid power differential protection algorithm that computes both the battery DC power $P_{DC}$ and the inverter/motor AC power $P_{AC}$. The inverter/motor AC power $P_{AC}$ is computed using the quadrature and direct voltages $V_q$ and $V_d$ received from the inverter controller and measurements of the quadrature and direct currents $I_d$ and $I_q$ respectively from current sensors 16e. The hybrid power differential protection algorithm then computes the AC power $P_{AC}$ ($P_{AC}=V_d*I_d+V_q*I_q$). The parameter $P_{AC}$ is the electrical power delivered by the inverter to the AC motor 30.

Referring again to FIG. 7, the hybrid power differential protection algorithm also computes the DC power $P_{DC}$ at the battery pack 18 (which is the input power to the DC/AC power protection zone) using the voltage $V_{bat}$ and current $I_{bat}$ at the battery terminal ($P_{DC}=V_{bat}*I_{bat}$). The hybrid power differential protection algorithm uses the computed AC power $P_{AC}$ and the computed inverter power losses $P_{inv}$ to compare it with the computed DC power $P_{DC}$. An additional optional term can be used to take into account the feeder losses using the product $R_{feeder}*I_a^2$. In the absence of a fault, based on the law of energy conservation, the difference in the powers ($P_{DP}$) at the input and output of the DC/AC power protection zone should be equal to zero ($P_{DP}=P_{AC}-P_{DC}=0$). In case of a fault in the DC/AC power protection zone, $P_{DC}$ and $P_{AC}$ will be different since the energy of the fault will be seen in $P_{DC}$ but not in $P_{AC}$. This protection is capable to detect small leakage energy between phase to phase inside the motor controller 50 or AC motor 30 and minimize the incidental energy in the fault.

Since the system is floating and a phase-to-ground fault does not create any short-circuit current, the hybrid power DP control module 20c is only monitoring the current in the positive (or negative) rail and need not measure both positive and negative rail current, as would be the case in a grounded system. The DC voltage is monitored with one voltage sensor in the BPDU 28 ($V_{BPDU}$). For the AC power $P_{AC}$, the quadrature and direct voltages $V_q$ and $V_d$ (used for pulse width modulation) from the control loop are used directly without adding any voltage sensor. The magnitudes of the quadrature and direct currents $I_q$ and $I_d$ are re-used from the control loop measurements. Thus, the third embodiment depicted in FIG. 7 creates a DC/AC power protection zone that covers the HVDC power distribution system 44 and the inverter inside motor controller 50 between the two measurement points. In case of a failure in that zone, the hybrid DP protection logic will detect $P_{DP}$ and sense the failure. For example, the hybrid power DP control module 20c may be configured to perform step 136 shown in FIG. 4 and then perform steps 116, 118, and 120 in sequence if the differential protection power $P_{DP}$ is greater than a difference threshold $P_{thr}$.

The hybrid differential protection is capable of detecting small leakage current and then minimizing the incidental energy in the fault. The proposed concept enables the extension of the protection zone across the inverter to cover both of the DC and AC systems in one zone. In contrast, state-of-the-art solutions implement separate protection zones for the DC and AC systems respectively. The use of multiple protection zones requires significant hardware and control to implement and leaves the DC-to-AC power conversion element (such as the inverter) unprotected. The hybrid power DP control module 20c covers both of the DC and AC zones, including the inverter, without adding any significant hardware (sensor or controller) in the battery or in the inverter/motor system.

The use of a power-computing algorithm increases the sensitivity of differential protection. The hybrid power differential protection algorithm disclosed herein is capable to detect parallel arcing and series arcing with proper digital filtering to isolate the arcing signature. The protection methodology measures the energy created by the arc (parallel or series) by subtracting the computed DC power $P_{DC}$ from the computed AC power $P_{AC}$. Based on the measured arc energy with digital filtering and integration, the hybrid power DP control module 20c can detect a repetitive arc and isolate it. For series and parallel arcing protection, the signatures may be different and different filtering algorithms may be used.

A high-power electric propulsion unit may include multiple AC motors and motor controllers coupled together. In addition, each motor controller may include multiple inverters, each inverter comprising a plurality of power switches. The power switches of each inverter are switched to supply 3-phase AC power to a motor.

Figure 8:
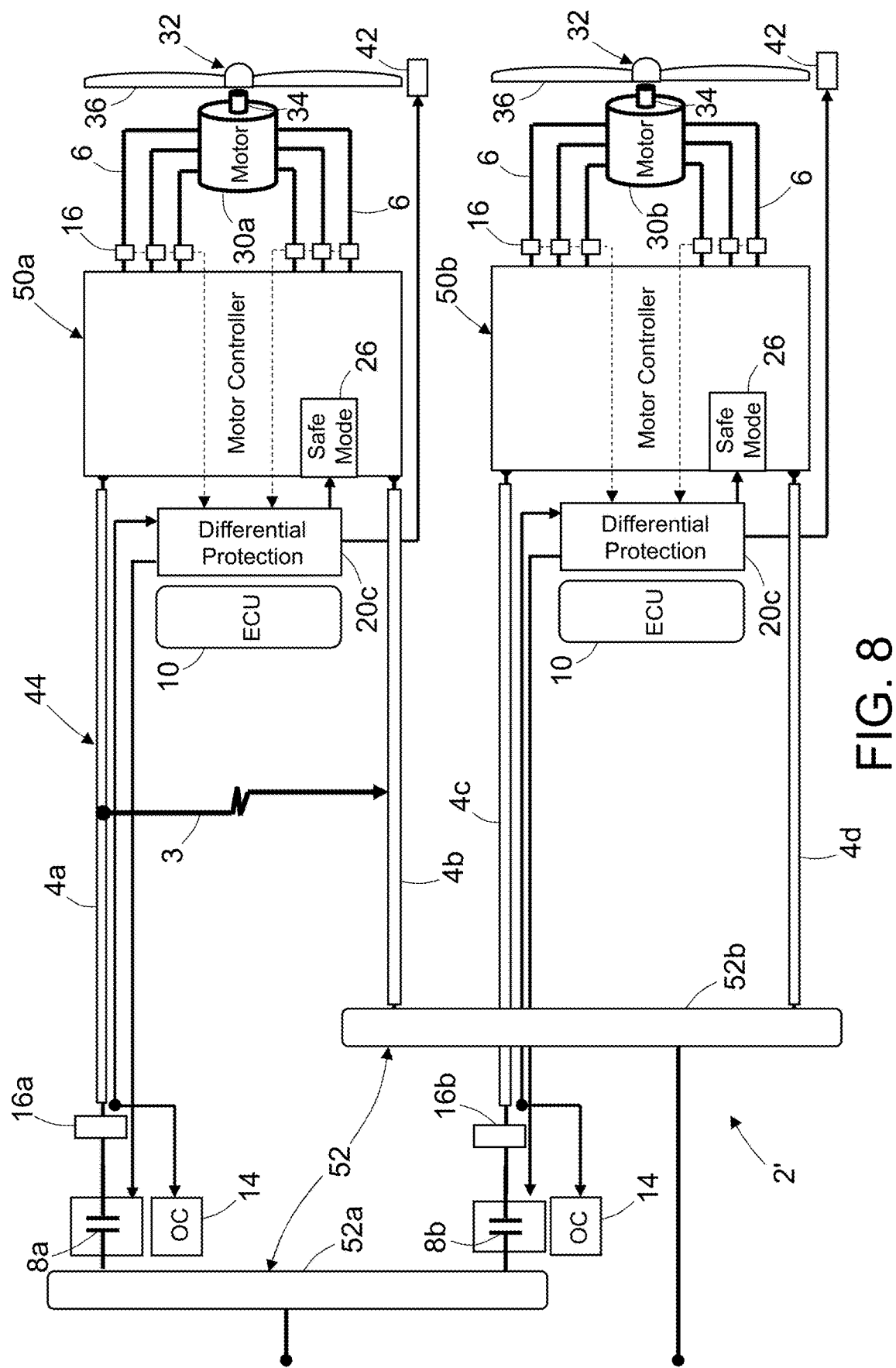
FIG. 8 is a diagram showing an arc fault across two DC power lines in an aerospace electric propulsion system comprising two motors and two motor controllers in accordance with a fourth embodiment.

FIG. 8 is a diagram showing an arc fault 3 across two HVDC power lines 4a and 4b in an electric propulsion system 2' comprising two AC motors 30a and 30b, two motor controllers 50a and 50b, and a HVDC power distribution system 44 in accordance with a fourth embodiment. The HVDC power distribution system 44 comprises an HVDC bus 52 consisting of positive and negative HVDC busbars 52a and 52b. The HVDC power distribution system 44 further includes the following power lines which connect the motor controllers 50a and 50b to the HVDC bus 52: (a)

a HVDC power line 4a that connects motor controller 50a to positive HVDC busbar 52a; (b) a HVDC power line 4b that connects motor controller 50a to negative HVDC busbar 52b; (c) a HVDC power line 4c that connects motor controller 50b to positive HVDC busbar 52a; and (d) a HVDC power line 4d that connects motor controller 50b to negative HVDC busbar 52b. The source end of HVDC power line 4a is connected to positive HVDC busbar 52a via a bus contactor 8a; the source end of HVDC power line 4c is connected to positive HVDC busbar 52a via a bus contactor 8b. The direct current flowing into HVDC power line 4a from positive HVDC busbar 52a is sensed by a current sensor 16a; the direct current flowing into HVDC power line 4c from positive HVDC busbar 52a is sensed by a current sensor 16b.

The an electric propulsion system 2' depicted in FIG. 8 further includes a DC/AC power differential protection system comprising a pair of hybrid power DP control modules 20c respectively connected to motor controllers 50a and 50b. In addition, one hybrid power DP control module 20c receives current data from current sensor 16a, while the other hybrid power DP control module 20c receives current data from current sensor 16a. The overcurrent protection control modules 14 also receive the current data from current sensors 16a and 16b respectively.

FIG. 8 depicts a scenario in which an arc fault 3 spans the HVDC power lines 4a and 4c, which are both connected to motor controller 50a. The hybrid power DP control modules 20c are configured to coordinate to isolate the faulty motor/inverter system (e.g., AC motor 30a/motor controller 50a) without tripping the healthy motor/inverter system (e.g., AC motor 30b/motor controller 50b), which are fed from the same HVDC bus 52. During the arc fault 3 in one branch, the battery pack (not shown in FIG. 8) will provide significant short-circuit current. During an HVDC system short circuit, the voltage level could sag significantly. If the voltage gets too low ($V_{HVDC} < V_{limit}$), the pulse width modulation process inside the inverter of motor controller 50a will stop and the AC motor 30a will keep spinning due to system inertia. The motor/inverter system (AC motor 30a/motor controller 50a) will regenerate high current into the arc fault. With the inertia of the motor rotor and associated propeller, the inverter/motor could regenerate for multiple seconds, creating significant short-circuit energy and potential damage. The hybrid power DP control module 20c associated with motor controller 50a is configured to isolate the faulty branch using the control logic previously described for the embodiment shown in FIG. 7.

Additionally, during the short circuit hard fault, the healthy AC motor 30b can also trip into under-voltage due to voltage sag ($V_{HVDC} < V_{limit}$) and regenerate into the fault. If the fault causes the HV system to sag enough, the healthy motor/inverter system (AC motor 30b/motor controller 50b) will regenerate and create significant current from the motor/inverter into the arc fault 3. The regeneration current from the healthy motor will contribute to the energy dissipated in the short circuit and to potential additional damage. Since there is no leakage energy in the healthy branch, the differential protection will not activate. To limit the fault incidental energy, it is important to limit and block the healthy motor/inverter current feedback into the fault. To minimize the fault energy for an external fault and limit the contribution of the motor/inverter, if no DP trip condition is detected and the conditions $V_{HVDC} < V_{limit}$ and $I_{MC} < 0$ are satisfied, the motor/inverter will enter the Safe mode to block regenerative current. As part of the Safe mode, the inverter switches to the Active Short Circuit (ASC) mode. In the ASC mode, an ASC command is issued that causes the top and/or bottom set of power switches of the inverter to close in order to short the motor on itself and block the regenerative current. Motor regenerative current will be blocked. This is critical to limit the incidental energy in the fault. To limit the incidental energy, the healthy motor controller will enter the Safe mode while the fault is being cleared. However the motor will stay in Standby mode and be ready to restart as soon as the fault has been cleared.

The protection logic proposed herein will monitor the bus voltage and compare it to the motor back EMF (observed using the speed). When the bus voltage is re-established to a voltage level guaranteeing that the healthy motor will not regenerate (fault cleared), the differential protection logic will clear the Safe mode and re-establish normal operation of the motor/inverter. Once the fault is cleared and the HVDC system voltage $V_{HVDC}$ is greater than $k_v \times EMF_{motor}$, the motor/inverter will go back to the Active mode While systems and methods for providing differential protection for an electric propulsion system have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The electric propulsion controller, engine control unit (a.k.a. engine controller), inverter controllers, and DP control modules disclosed herein may be implemented using hardware or hardware in combination with software. For example, a controller or control module may be implemented using configurable hardware, a programmable device, or both. Configurable hardware may comprise hardware that is configurable to perform one or more functions of the controller. A programmable device may comprise any device that is programmable to implement one or more functions of the controller. For example, without limitation, the programmable device may comprise a central processing unit, a microprocessor, or a digital signal processor. The programmable device may be configured to run software or firmware in the form of program instructions to implement one or more functions of the controller. Program instructions may be stored in any appropriate non-transitory tangible computer-readable storage medium for execution by, or transfer to, the programmable device.

In particular, the DP control modules disclosed herein are configured in accordance with control logic that includes one or more of the algorithms for providing the differential protection disclosed herein. A control module may be a unit of distinct functionality that may be implemented in software, hardware, or combinations thereof. When the functionality of a control module is performed in any part through software, the module can include a non-transitory tangible computer-readable storage medium. The methods disclosed above may employ streaming (or on-the-fly) calculations, in which case the control module configured to perform those calculations is suitable for FPGA or ASIC or other hardware-based implementation.

The methods described and claimed herein may include steps encoded as executable instructions embodied in a non-transitory tangible computer-readable storage medium, including, without limitation, a storage device and/or a memory device. Such instructions, when executed by a processing or computing system, cause the system device to perform at least a portion of the methods described herein.

In the method claims appended hereto, any alphabetic ordering of steps is for the sole purpose of enabling subsequent short-hand references to antecedent steps and not for the purpose of limiting the scope of the claim to require that the method steps be performed in alphabetic order.

The invention claimed is:

1. A method for protecting an electric propulsion system, the method comprising:
   (a) sensing a first current supplied by a battery pack at a first end of a protection zone that includes at least a portion of a power line that is connected to receive current from the battery pack and supply current to a motor controller;
   (b) sensing a second current supplied to the motor controller at a second end of the protection zone;
   (c) receiving sensor data representing a magnitude of the first current sensed in step (a);
   (d) receiving sensor data representing a magnitude of the second current sensed in step (b);
   (e) calculating a current difference equal to a difference between the magnitude of the first current and the magnitude of the second current;
   (f) determining that the current difference exceeds a difference threshold indicating a fault in the protection zone;
   (g) commanding the electric propulsion system to operate in a mode that isolates the fault in response to step (f); and
   (h) operating the electric propulsion system in a mode that isolates the fault,
   wherein steps (c) through (g) are performed by a differential protection control module, and
   wherein step (h) comprises changing states of power switches in the motor controller to short an AC motor connected to the motor controller, thereby blocking current regenerated by the AC motor from reaching the power line.

2. The method as recited in claim 1, wherein step (a) comprises sensing the current supplied by the battery pack using a current sensor which is located along a busbar that is connected to the battery pack.

3. The method as recited in claim 1, wherein step (a) comprises sensing the current supplied by the battery pack using a plurality of current sensor which are respectively located along a plurality of battery strings of the battery pack.

4. The method as recited in claim 1, wherein step (h) further comprises opening a contactor disposed between the battery pack and the first end of the protection zone.

5. The method as recited in claim 4, wherein step (h) further comprises mechanically disconnecting the AC motor from the second end of the protection zone.

6. An electric propulsion system comprising:
   a battery pack comprising a plurality of strings of battery modules;
   a busbar connected to receive DC power from the battery pack;
   a power line connected to receive DC power from the busbar;
   a motor controller comprising power switches which are connected to receive DC power from the power line and configured to convert the DC power to AC power;
   an AC motor connected to receive the AC power from the motor controller;
   one or more first current sensors connected to sense a first current supplied by the battery pack to a first end of a protection zone that includes at least a portion of the power line and configured to output first sensor data representing a magnitude of the first current;
   a second current sensor connected to sense a second current supplied to the motor controller at a second end of the protection zone and configured to output second sensor data representing a magnitude of the second current; and
   a differential protection control module connected to receive the first and second sensor data, wherein the differential protection control module is configured to perform operations comprising:
   (a) calculating a current difference equal to a difference between the magnitude of the first current and the magnitude of the second current;
   (b) determining that the current difference exceeds a difference threshold indicating a fault in the protection zone; and
   (c) commanding the electric propulsion system to operate in a mode that isolates the fault in response to operation (b) by changing states of the power switches in the motor controller to short the AC motor, thereby blocking current regenerated by the AC motor from reaching the power line.

7. The electric propulsion system as recited in claim 6, further comprising a propeller mechanically coupled to the AC motor.

8. The electric propulsion system as recited in claim 6, wherein the first current sensor is located along the busbar.

9. The electric propulsion system as recited in claim 6, wherein a plurality of first current sensors are respectively located along the plurality of strings of battery modules.

10. A method for protecting an electric propulsion system, the method comprising:
   (a) sensing a first current supplied by a battery pack at a first end of a protection zone that includes at least a portion of a power line that is connected to receive current from the battery pack and supply current to a motor controller;
   (b) sensing a second current supplied to the motor controller at a second end of the protection zone;
   (c) sensing a first voltage at the first end of the protection zone;
   (d) sensing a second voltage at the second end of the protection zone;
   (e) receiving sensor data representing a magnitude of the first current sensed in step (a);
   (f) receiving sensor data representing a magnitude of the second current sensed in step (b);
   (g) receiving sensor data representing a magnitude of the first voltage sensed in step (c);
   (h) receiving sensor data representing a magnitude of the second voltage sensed in step (d);
   (i) calculating an integrated power difference based on the magnitudes received in steps (e) through (h) at a succession of instants during a window of time, wherein the integrated power difference is derived by integrating a difference between a first power at the first end of the protection zone and a second power at the second end of the protection zone;
   (j) determining that the integrated power difference exceeds an integrated difference threshold indicating a fault in the protection zone;

(k) commanding the electric propulsion system to operate in a mode that isolates the fault in response to step (j); and (l) operating the electric propulsion system in a mode that isolates the fault, wherein steps (e) through (k) are performed by a differential protection control module, and wherein step (l) comprises changing states of power switches in the motor controller to short an AC motor connected to the motor controller, thereby blocking current regenerated by the AC motor from reaching the power line.

11. The method as recited in claim 10, wherein step (l) further comprises opening a contactor disposed between the battery pack and the first end of the protection zone.

12. The method as recited in claim 11, wherein step (1) further comprises mechanically disconnecting the AC motor from the second end of the protection zone, wherein steps (c) through (g) are performed by the differential protection control module.

13. The method as recited in claim 10, wherein the first end of the protection zone is located along a busbar that is connected to a plurality of parallel strings of battery modules of the battery pack.

14. The method as recited in claim 10, wherein the second end of the protection zone is located inside the motor controller.

15. An electric propulsion system comprising:
a battery pack comprising parallel strings of battery modules;
a busbar connected to receive DC power from the battery pack;
a power line connected to receive DC power from the busbar;
a motor controller comprising power switches which are connected to receive DC power from the power line and configured to convert the DC power to AC power;
an AC motor connected to receive AC power from the motor controller;
a first current sensor connected to sense a first current supplied by the battery pack to a first end of a protection zone that includes at least a portion of the power line and configured to output first sensor data representing a magnitude of the first current;
a first voltage sensor connected to sense a first voltage at the first end of the protection zone current and configured to output second sensor data representing a magnitude of the first voltage;
a second current sensor connected to sense a second current supplied to the motor controller at a second end of the protection zone and configured to output third sensor data representing a magnitude of the second current;
a second voltage sensor connected to sense a second voltage at the second end of the protection zone current and configured to output fourth sensor data representing a magnitude of the second voltage; and
a differential protection control module connected to receive the first through fourth sensor data, wherein the differential protection control module is configured to perform operations comprising:

(a) calculating an integrated power difference based on the first through fourth sensor data received at a succession of instants during a window of time, wherein the integrated power difference is derived by integrating a difference between a first power at the first end of the protection zone and a second power at the second end of the protection zone;

(b) determining that the integrated power difference exceeds an integrated difference threshold indicating a fault in the protection zone; and (c) commanding the electric propulsion system to operate in a mode that isolates the fault in response to operation (b) by changing states of the power switches in the motor controller to short the AC motor, thereby blocking current regenerated by the AC motor from reaching the power line.

16. The electric propulsion system as recited in claim 15, wherein the first end of the protection zone is located along the busbar.

17. The electric propulsion system as recited in claim 15, wherein the second end of the protection zone is located inside the motor controller.

18. A method for protecting an electric propulsion system, the method comprising:

(a) sensing a DC current supplied by a battery pack at a first end of a protection zone that includes at least a portion of a power line that is connected to receive DC current from the battery pack and supply DC current to a motor controller;

(b) sensing AC currents supplied to an AC motor by the motor controller at a second end of the protection zone;

(c) sensing a DC voltage at the first end of the protection zone;

(d) sensing AC voltages at the second end of the protection zone;

(e) receiving sensor data representing a magnitude of the DC current sensed in step (a);

(f) receiving sensor data representing magnitudes of the AC currents sensed in step (b);

(g) receiving sensor data representing a magnitude of the DC voltage sensed in step (c);

(h) receiving sensor data representing magnitudes of the AC voltages sensed in step (d);

(i) calculating an integrated power difference based on the magnitudes received in steps (e) through (h) at a succession of instants during a window of time and a magnitude of power losses inside the motor controller, wherein the integrated power difference is derived by integrating a difference between a first power at the first end of the protection zone and a second power at the second end of the protection zone minus the power losses;

(j) determining that the integrated power difference exceeds an integrated difference threshold indicating a fault in the protection zone;

(k) commanding the electric propulsion system to operate in a mode that isolates the fault in response to step (j); and (l) operating the electric propulsion system in a mode that isolates the fault, wherein steps (e) through (k) are performed by a differential protection control module, and wherein step (l) comprises changing states of power switches in the motor controller to short an AC motor connected to the motor controller, thereby blocking current regenerated by the AC motor from reaching the power line.

19. The method as recited in claim 18, wherein step (l) further comprises opening a contactor disposed between the battery pack and the first end of the protection zone.

20. The method as recited in claim 18, wherein step (l) further comprises mechanically disconnecting the AC motor from the second end of the protection zone.

* * * * *